(12) United States Patent
Suzuki

(10) Patent No.: US 7,459,995 B2
(45) Date of Patent: Dec. 2, 2008

(54) NOISE SUPPRESSION CIRCUIT

(75) Inventor: Mitsunari Suzuki, Tokyo (JP)

(73) Assignee: TDK Corporation, Tokyo (JP)

( * ) Notice: Subject to any disclaimer, the term of this patent is extended or adjusted under 35 U.S.C. 154(b) by 172 days.

(21) Appl. No.: 10/594,460

(22) PCT Filed: Jan. 31, 2005

(86) PCT No.: PCT/JP2005/001364

§ 371 (c)(1),
(2), (4) Date: Sep. 29, 2006

(87) PCT Pub. No.: WO2005/101626

PCT Pub. Date: Oct. 27, 2005

(65) Prior Publication Data

US 2007/0241838 A1    Oct. 18, 2007

(30) Foreign Application Priority Data

Mar. 31, 2004   (JP) ............................. 2004-106098

(51) Int. Cl.
*H03H 7/00* (2006.01)
(52) U.S. Cl. ...................... 333/172; 333/181
(58) Field of Classification Search ............... 333/167, 333/172, 181
See application file for complete search history.

(56) References Cited

U.S. PATENT DOCUMENTS 5,907,242 A * 5/1999 Gard .......................... 324/326
5,977,845 A * 11/1999 Kitahara .................... 333/184
2007/0252664 A1* 11/2007 Saitoh et al. ................ 333/175

FOREIGN PATENT DOCUMENTS

| JP | A 53-64446 | 6/1978 |
| JP | U 56-2632 | 1/1981 |
| JP | U 57-117822 | 7/1982 |
| JP | A 5-121988 | 5/1993 |
| JP | A 9-102723 | 4/1997 |
| JP | A 10-13180 | 1/1998 |
| JP | B2 2784783 | 5/1998 |

* cited by examiner

*Primary Examiner*—Don P Le
(74) *Attorney, Agent, or Firm*—Oliff & Berridge, PLC

(57) ABSTRACT

A small-sized noise suppression circuit capable of suppressing noise in a wide frequency range is realized. A noise suppression circuit has first and second inductors inserted in series in a first conductive line, and a series circuit configured to have a third inductor and a first capacitor connected in series. One end of the series circuit is connected to a junction of the first and second inductors and the other end is connected to a second conductive line. Even when a coupling coefficient k between the first and second inductors is smaller than 1, by adjusting the value of the inductance of the third inductor in accordance with the value of the coupling coefficient k, an attenuation characteristic which is almost the same as or similar to that in an ideal state is obtained.

12 Claims, 16 Drawing Sheets

NOISE SUPPRESSION CIRCUIT

TECHNICAL FIELD

The present invention relates to a noise suppression circuit for suppressing noise propagating through a conductive line.

BACKGROUND ART

A power electronic device such as a switching power supply, an inverter, a lighting circuit of a lighting device, or the like has a power converting circuit for converting power. The power converting circuit has a switching circuit for converting direct current to alternating current having rectangular waveforms. Consequently, the power converting circuit generates a ripple voltage having frequency equal to switching frequency of the switching circuit, and noise accompanying the switching operation of the switching circuit. The ripple voltage and noise exerts adverse influence on the other devices. Consequently, it is necessary to provide means for reducing the ripple voltage and noise between the power converting circuit and the other devices or a line.

As means for reducing the ripple voltage and noise, a filter including an inductance element (inductor) and a capacitor, so-called an LC filter is often used. The LC filters include a filter having one inductance element and one capacitor, a T filter, and a π filter. A common noise filter for preventing electromagnetic interference (EMI) is one of LC filters. A general EMI filter is configured by combining discrete elements such as a common-mode choke coil, a normal-mode choke coil, an X capacitor, a Y capacitor, and the like.

Recently, power-line communication is regarded as a promising communication technique used at the time of configuring a communication network in a house and is being developed. In the power-line communication, communication is performed by multiplexing a high frequency signal on a power line. In the power-line communication, noise occurs on a power line by various electric/electronic devices connected to the power line, and it causes deterioration in communication quality such as increase in the error rate. Consequently, means for reducing noise on the power line is necessary. In the power-line communication, it is necessary to prevent a communication signal on an indoor power line from leaking to an outdoor power line. The LC filter is also used as means for reducing noise on the power line and preventing a communication line on an indoor power line from leaking to an outdoor power line.

Noises propagating through two conductive lines include a normal-mode (differential-mode) noise generating a potential difference between two conductive lines and a common-mode noise propagating in the same phase in the two conductive lines.

Japanese Patent Laid-open No. Hei 9-102723 describes a line filter using a transformer. The line filter has a transformer and a filter circuit. A secondary winding of the transformer is inserted in one of the two conductive lines for transmitting power to be supplied from an alternate current power supply to a load. Two input terminals of the filter circuit are connected to both ends of an alternate current power supply, and two output terminals of the filter circuit are connected to both ends of a primary winding of the transformer. In the line filter, a noise component is extracted from a power supply voltage by the filter circuit and supplied to the primary winding of the transformer, and the noise component is subtracted from the power supply voltage on the conductive line in which the secondary winding of the transformer is inserted. The line filter reduces the noise in the normal mode.

Japanese Patent Laid-open No. Hei 5-121988 (FIG. 1) discloses a low-pass filter including three impedance elements. The low-pass filter has two high-impedance elements inserted in series in one of two conductive lines, and a low-impedance element whose one end is connected between the two high-impedance elements and whose other end is connected to the other one of the two conductive lines. Each of the two high-impedance elements includes a parallel connection circuit of a coil and a resistor, and the low-impedance element includes a capacitor. The low-pass filter reduces the normal-mode noise.

Japanese Patent No. 2,784,783 (FIG. 6) discloses a normal-mode noise filter circuit for reducing the normal-mode noise, and a common-mode noise filter circuit for reducing the common mode noise. The normal-mode noise filter circuit is configured to have two coils inserted in two conductive lines and a capacitor connecting some midpoints in windings of the coils. The common-mode noise filter circuit is configured to have two coils inserted in the two conductive lines and two capacitors provided between some midpoints in the windings of the coils and the ground.

Each of the conventional LC filters has a peculiar resonance frequency determined by inductance and capacitance, so that it has a problem such that a desired attenuation can be obtained only in a narrow frequency range.

The filter inserted in the conductive line for power transmission is requested to obtain a desired characteristic in a state where current for power transmission flows and to have a countermeasure against temperature rise. Consequently, the inductance element in the filter for the power converting circuit uses, as a magnetic core, a ferrite core with a gap. However, the characteristic of such an inductance element is similar to that of an inductance element using an air core, so that there is a problem such that, to realize a desired characteristic, the size of the inductance element becomes large.

In the line filter disclosed in Japanese Patent Laid-open No. Hei 9-102723, the coupling coefficient of the transformer is 1. If the filter circuit does not exert influence on the line filter, theoretically, the noise component can be completely removed. In reality, however, it is impossible to set the coupling coefficient of the transformer to 1, and the attenuation characteristic deteriorates as the coupling coefficient decreases. In particular, in the case where the filter circuit is configured by the capacitor, a series resonance circuit is configured by the capacitor and the primary winding of the transformer. Consequently, the impedance of a signal path including the capacitor and the primary winding of the transformer decreases only in a narrow frequency range close to the resonance frequency of the series resonance circuit. As a result, with the line filter, the noise component can be removed only in the narrow frequency range. From the above, a line filer actually configured has a problem such that it cannot efficiently remove a noise component in a wide frequency range.

Since the noise reduction principle of the low-pass filter described in Japanese Patent Laid-open No. Hei 5-121988 (FIG. 1) and the filter circuit described in Japanese Patent No. 2,784,783 (FIG. 6) is similar to that of the conventional LC filter, they also have a problem similar to that of the conventional LC filter.

In the respective countries, various controls are established over noise, that is, noise terminal voltage leaked from an electronic device to the outside via an AC power supply line. For example, CISPR (International Special Committee on Radio Interference) sets the control on noise terminal voltage in the frequency range of 150 kHz to 30 MHz. In the case of reducing noise in such a wide frequency range, particularly, on reduction of noise in a low frequency range of 1 MHz or less, the following problem occurs. Specifically, in the frequency range of 1 MHz or less, the absolute value of the impedance of a coil is expressed by $2\pi fL$ where the inductance of the coil is L and frequency is f. Therefore, generally, to reduce noise in the frequency range of 1 MHz or less, a filter including a coil having large inductance is necessary. As a result, the filter becomes large.

DISCLOSURE OF INVENTION

The present invention has been achieved in view of the problems and it is desirable to provide a small-sized noise suppression circuit capable of suppressing noise in a wide frequency range.

A noise suppression circuit according to a first aspect of the invention is a circuit suppressing normal mode noise transmitted on first and second conductive lines and generating a potential difference between the first and the second conductive lines, and includes: first and second inductors inserted in series in the first conductive line and magnetically coupled to each other; and a series circuit configured to have a third inductor and a first capacitor connected in series, one end of the serried circuit being connected to a junction of the first and second inductors, and other end being connected to the second conductive line. A coupling coefficient k between the first and second inductors is smaller than 1, and the inductance of the third inductor is set to a value so that a desired noise attenuation characteristic is realized on condition that the coupling coefficient k is smaller than 1.

In the noise suppression circuit according to the first aspect of the invention, the first and second inductors are electromagnetically coupled to each other. The first and second inductors may be formed by different windings or a single winding. In the case of forming the first and second inductors by a single winding, for example, it is sufficient to provide a connection point in some midpoint of the single winding, use a portion from one end of the winding to the connection point as a first inductor, and use a portion from the other end of the winding to the connection point as a second inductor. One end of the series circuit is connected to the connection point. In the noise suppression circuit according to the first aspect of the invention, the inductances of the first and second inductors may be the same value. In the case of forming the first and second inductors by a single winding, for example, by providing the connection point in the middle point of the single winding, the inductances can be made equal to each other.

A connection part in which one end of the series circuit is connected to the first and second inductors is called a first end, and a connection part of the other end connected to the second conductive line is called a second end. An end opposite to the first end in the first inductor is called one end of the first inductor, and an end on the first end side in the first inductor is called the other end of the first inductor. An end on the first end side in the second inductor is called one end part of the second inductor, and an end opposite to the first end part in the second inductor is called the other end of the second inductor.

In the noise suppression circuit according to the first aspect of the invention, when a voltage in the normal mode is applied across one end of the first inductor and the second end in the second conductive line, the voltage is divided by the first inductor and the series circuit, and predetermined voltages in the same direction are generated across both ends of the first inductor and across both ends of the series circuit. Since the first and second inductors are electromagnetically coupled to each other, a predetermined voltage is generated across both ends of the second inductor in accordance with the voltage generated across both ends of the first inductor. Since one end of the series circuit is connected to a junction of the first and second inductors, the direction of the voltage generated across both ends of the second inductor is opposite to the direction of the voltage generated across both ends of the series circuit, so that the voltages cancel out each other. As a result, the voltage across the other end of the second inductor and the second end becomes smaller than the voltage applied across one end of the first inductor and the second end.

In the noise suppression circuit according to the first aspect of the invention, also in the case where the voltage in the normal mode is applied across the other end of the second inductor and the second end in the second conductive line, in a manner similar to the above, the voltage across one end of the first inductor and the second end becomes smaller than the voltage applied across the other end of the second inductor and the second end.

In the noise suppression circuit according to the first aspect of the invention, the inductance of the third inductor is set to a value so that a desired noise attenuation characteristic is realized on condition that the coupling coefficient k is smaller than 1. Consequently, for example, a frequency characteristic of a noise attenuation can be obtained, which is almost the same as or similar to that in the ideal state or partly more excellent than that in the ideal state. The ideal state in this case denotes a state where the coupling coefficient k is assumed as 1 and the values of the inductances L1 to L3 are optimized. For example, the ideal state is a state in which L1 and L2 are set to the same value L0 and L3 is also set to the same value L0.

In the noise suppression circuit according to the first aspect of the invention, in particular, in the case where the inductance L3 of the third inductor is set so as to satisfy the following condition, the frequency characteristic of the noise attenuation almost the same as that in the ideal state is obtained.

$$L3 = k(L1 \times L2)^{1/2} \qquad (1)$$

(where L1 represents inductance of the first inductor, and L2 represents inductance of the second inductor.)

In particular, in the case where the inductance L3 of the third inductor is set so as to satisfy the following conditions, a resonance point which does not exist in the ideal state is obtained. Consequently, a region in which the attenuation characteristic is better than that in the ideal state is created, partly in the frequency region higher than the cutoff frequency.

$$L3 > k(L1 \times L2)^{1/2} \text{ and}$$

$$L3 \leq (L1+M) \times (L2+M)/(L1+L2+2M) + M \qquad (2)$$

(where $M = k(L1 \times L2)^{1/2}$, L1 represents inductance of the first inductor, and L2 represents inductance of the second inductor.)

In particular, in the case where the inductance L3 of the third inductor is set so as to satisfy the following conditions, a frequency characteristic of the noise attenuation similar to that in the ideal state is obtained.

$$L3 < k(L1 \times L2)^{1/2} \text{ and}$$

$$L3 \geq 0.9 \times k \times (L1 \times L2)^{1/2} \qquad (3)$$

(where L1 represents inductance of the first inductor, and L2 represents inductance of the second inductor.)

A noise suppression circuit according to a second aspect of the invention is a circuit suppressing normal mode noise transmitted on first and second conductive lines and generating a potential difference between the first and the second conductive lines, including: first and second inductors inserted in series in the first conductive line and magnetically coupled to each other; a series circuit configured to have a third inductor and a first capacitor connected in series; and fourth and fifth inductors inserted in series in the second conductive line and magnetically coupled to each other. One end of the series circuit is connected to a junction of the first and second inductors, and the other end is connected to a junction of the fourth and fifth inductors. Each of a coupling coefficient k1 between the first and second inductors and a coupling coefficient k2 between the fourth and fifth inductors is smaller than 1, and the inductance of the third inductor is set to a value so that a desired noise attenuation characteristic is realized on condition that each of the coupling coefficients k1 and k2 is smaller than 1.

In the noise suppression circuit according to the second aspect of the invention, in a manner similar to the noise suppression circuit according to the first aspect, the first and second inductors are electromagnetically coupled to each other. The first and second inductors may be formed by the different windings or a single winding. The fourth and fifth inductors can be similarly formed. In the case of forming the fourth and fifth inductors by a single winding, for example, it is sufficient to provide a connection point in some midpoint of the single winding, set a portion from one end of the winding to the connection point as a fourth inductor, and set a portion from the other end of the winding to the connection point as a fifth inductor. The other end of the series circuit is connected to the connection point. In the noise suppression circuit according to the second aspect of the invention, the inductances of the fourth and fifth inductors may be the same value. In the case of forming the fourth and fifth inductors by a single winding, for example, by providing the connection point in the middle point of the single winding, the inductances can be made equal to each other.

A connection part in which one end of the series circuit is connected to the first and second inductors is called a first end, and a connection part in which the other end is connected to the fourth and fifth inductors is called a second end. The end opposite to the first end in the first inductor is called one end of the first inductor, and the end on the first end side in the first inductor is called the other end of the first inductor. The first end side in the second inductor is called one end of the second inductor, and the end opposite to the first end in the second inductor is called the other end of the second inductor. The end opposite to the second end in the fourth inductor is called one end of the fourth inductor, and an end on the second end side in the fourth inductor is called the other end of the fourth inductor. The end on the second end side in the fifth inductor is called one end of the fifth inductor, and the end opposite to the second end in the fifth inductor is called the other end of the fifth inductor.

In the noise suppression circuit according to the second aspect of the invention, when a voltage in the normal mode is applied across one end of the first inductor and one end of the fourth inductor, the voltage is divided by the first inductor, the series circuit, and the fourth inductor, and predetermined voltages are generated across both ends of the first inductor, across both ends of the series circuit, and both ends of the fourth inductor. Since the first and second inductors are electromagnetically coupled to each other, a predetermined voltage is generated across both ends of the second inductor in accordance with the voltage generated across both ends of the first inductor. Similarly, the fourth and fifth inductors are electromagnetically coupled to each other, a predetermined voltage is generated across both ends of the fifth inductor in accordance with the voltage generated across both ends of the fourth inductor. Since one end of the series circuit is connected to a junction of the first and second inductors and the other end is connected to a junction of the fourth and fifth inductors, the direction of the voltage generated across both ends of the second inductor and the direction of the voltage generated across both ends of the fifth inductor are opposite to the direction of the voltage generated across both ends of the series circuit, so that the voltages cancel out each other. As a result, the voltage across the other end of the second inductor and the other end of the fifth inductor becomes smaller than the voltage applied across one end of the first inductor and one end of the fourth inductor.

In the noise suppression circuit according to the second aspect of the invention, also in the case where the voltage in the normal mode is applied across the other end of the second inductor and the other end in the fifth inductor, in a manner similar to the above, the voltage across one end of the first inductor and one end of the fourth inductor becomes smaller than the voltage applied across the other end of the second inductor and the other end of the fifth inductor.

In the noise suppression circuit according to the second aspect of the invention, the inductance of the third inductor is set to a value so that a desired noise attenuation characteristic is realized on condition that the coupling coefficients k1 and k2 are smaller than 1. Consequently, a frequency characteristic of a noise attenuation can be obtained, which is almost the same as or similar to that in the ideal state or partly more excellent than that in the ideal state. The ideal state in this case denotes a state where each of the coupling coefficients k1 and k2 is assumed as 1 and the values of the inductances L1 to L5 are optimized. For example, the ideal state is a state in which L1, L2, L4, and L5 are set to the same value L0 and L3 is also set to a value twice as large as L0.

In the noise suppression circuit according to the second aspect of the invention, particularly, in the case where the inductance L3 of the third inductor is set so as to satisfy the following conditions, a frequency characteristic of the noise attenuation almost the same as that in the ideal state is obtained.

$$L3 = M1 + M2,$$

$$M1 = k1 \times (L1 \times L2)^{1/2} \qquad (4\text{-}1), \text{ and}$$

$$M2 = k2 \times (L4 \times L5)^{1/2} \qquad (4\text{-}2)$$

(where L1 represents inductance of the first inductor, L2 represents inductance of the second inductor, L4 represents inductance of the fourth inductor, and L5 represents inductance of the fifth inductor.)

In particular, in the case where the inductance L3 of the third inductor is set so as to satisfy the following conditions, a resonance point which does not exist in the ideal state is obtained at a frequency characteristic of the noise attenuation. Consequently, a region in which the attenuation characteristic is better than that in the ideal state is created, partly in the frequency region higher than the resonance point.

$$L3 > M1 + M2 \text{ and}$$

$$L3 \leq (L1 + L4 + M1 + M2) \times (L2 + L5 + M1 + M2) / \{L1 + L2 + L4 + L5 + 2 \times (M1 + M2)\} + M1 + M2 \qquad (5)$$

(where $M1 = k1 \times (L1 \times L2)^{1/2}$, $M2 = k2 \times (L4 \times L5)^{1/2}$, L1 represents inductance of the first inductor, L2 represents inductance of the second inductor, L4 represents inductance of the fourth inductor, and L5 represents: inductance of the fifth inductor.)

In particular, in the case where the inductance L3 of the third inductor is set so as to satisfy the following conditions, the frequency characteristic of the noise attenuation similar to that in the ideal state is obtained.

$$L3 < M1 + M2 \text{ and}$$

$$L3 \geq 0.9 \times (M1 + M2) \quad (6)$$

(where $M1 = k1 \times (L1 \times L2)^{1/2}$, $M2 = k2 \times (L4 \times L5)^{1/2}$, L1 represents inductance of the first inductor, L2 represents inductance of the second inductor, L4 represents inductance of the fourth inductor, and L5 represents inductance of the fifth inductor.)

A noise suppression circuit according to a third aspect of the invention is a circuit suppressing normal mode noise transmitted on first and second conductive lines and generating a potential difference between the first and the second conductive lines, and includes: first and second inductors inserted in series in the first conductive line and magnetically coupled to each other; a series circuit configured to have a third inductor and a first capacitor connected in series; and fourth and fifth inductors inserted in series in the second conductive line and magnetically coupled to each other and magnetically coupled to the first and second inductors. One end of the series circuit is connected to a junction of the first and second inductors, and the other end is connected to a junction of the fourth and fifth inductors. Each of a coupling coefficient k1 between the first and second inductors, a coupling coefficient k2 between the fourth and fifth inductors, a coupling coefficient k3 between the first and fourth inductors, a coupling coefficient k4 between the second and fifth inductors, a coupling coefficient k5 between the first and fifth inductors, and a coupling coefficient k6 between the second and fourth inductors is smaller than 1, and the inductance of the third inductor is set to a value so that a desired noise attenuation characteristic is realized on condition that each of the coupling coefficients k1, k2, k3, k4, k5, and k6 is smaller than 1.

The noise suppression circuit according to the third aspect of the invention is similar to the noise suppression circuit according to the second aspect with respect to the basic operation of noise suppression except that the first and second inductors on the first conductive line and the fourth and fifth inductors on the second conductive line are magnetically coupled to each other.

In the noise suppression circuit according to the third aspect, the inductance of the third inductor is set to a value so that a desired noise attenuation characteristic is realized on condition that each of the coupling coefficients k1, k2, k3, k4, k5, and k6 is smaller than 1. Therefore, the frequency characteristic of noise attenuation, for example, the same as or similar to that in the ideal state or partly more excellent than the ideal state is obtained. The ideal state is a state in which the values of the inductances L1 to L5 are optimized on assumption that each of the coupling coefficients k1 to k6 is equal to 1. For example, the ideal state is a state in which all of the inductances L1, L2, L4, and L5 are set to the same value L0 and the inductance L3 is four times as large as L0.

In the noise suppression circuit according to the third aspect of the invention, in particular, when the inductance L3 of the third inductor is set so as to satisfy the following conditions, the frequency characteristic of noise attenuation the same as or similar to that in the ideal state is obtained.

$$L3 = M1 + M2 + M5 + M6,$$

$$M1 = k1 \times (L1 \times L2)^{1/2} \quad (7-1),$$

$$M2 = k2 \times (L4 \times L5)^{1/2} \quad (7-2),$$

$$M5 = k5 \times (L1 \times L5)^{1/2} \quad (7-3), \text{ and}$$

$$M6 = k6 \times (L2 \times L4)^{1/2} \quad (7-4)$$

(where L1 represents inductance of the first inductor, L2 represents inductance of the second inductor, L4 represents inductance of the fourth inductor, and L5 represents inductance of the fifth inductor.)

In particular, in the case where the inductance L3 of the third inductor is set so as to satisfy the following conditions, a resonance point which does not exist in the ideal state is obtained with respect to the frequency characteristic of noise attenuation. Consequently, a region in which the attenuation characteristic is better than that in the ideal state is created, partly in the frequency region higher than the resonance point.

$$L3 > M1 + M2 + M5 + M6 \text{ and}$$

$$L3 \leq (L1 + L4 + M1 + M2 + 2 \times M3 + M5 + M6) \times (L2 + L5 + M1 + M2 + 2 \times M4 + M5 + M6) / \{L1 + L2 + L4 + L5 + 2 \times (M1 + M2 + M3 + M4 + M5 + M6)\} + M1 + M2 + M5 + M6 \quad (8)$$

(where $M1 = k1 \times (L1 \times L2)^{1/2}$, $M2 = k2 \times (L4 \times L5)^{1/2}$, $M5 = k5 \times (L1 \times L5)^{1/2}$, $M6 = k6 \times (L2 \times L4)^{1/2}$, L1 represents inductance of the first inductor, L2 represents inductance of the second inductor, L4 represents inductance of the fourth inductor, and L5 represents inductance of the fifth inductor.)

In particular, in the case where the inductance L3 of the third inductor is set to satisfy the following conditions, the frequency characteristic of noise attenuation similar to that in the ideal state is obtained.

$$L3 < M1 + M2 + M5 + M6 \text{ and}$$

$$L3 \geq 0.9 \times (M1 + M2 + M5 + M6) \quad (9)$$

(where $M1 = k1 \times (L1 \times L2)^{1/2}$, $M2 = k2 \times (L4 \times L5)^{1/2}$, $M5 = k5 \times (L1 \times L5)^{1/2}$, $M6 = k6 \times (L2 \times L4)^{1/2}$, L1 represents inductance of the first inductor, L2 represents inductance of the second inductor, L4 represents inductance of the fourth inductor, and L5 represents inductance of the fifth inductor.)

In the noise suppression circuits according to each aspect, as the first and second conductive lines, conductive lines in single-phase two-wire power lines or two lines in single-phase three-wire power lines which are currently often used for power supply can be used.

In the noise suppression circuit according to each aspect of the invention, noise can be suppressed in a wide frequency range, and miniaturization can be; realized. In particular, the inductance L3 in the series circuit is set to a proper value on condition that the coupling coefficient is smaller than 1. Thus, the frequency characteristic of noise attenuation which is almost the same as or similar to that in the ideal state, or a characteristic partly more excellent than that in the ideal state can be obtained.

BEST MODE FOR CARRYING OUT THE INVENTION

Embodiments of the present invention will be described in detail hereinbelow with reference to the drawings.

FIRST EMBODIMENT

First, a noise suppression circuit according to a first embodiment of the invention will be described. The noise suppression circuit according to the first embodiment is a circuit for suppressing normal-mode (differential-mode) noise which is propagated through two conductive lines and causes the potential difference between the conductive lines.

Figure 1A:
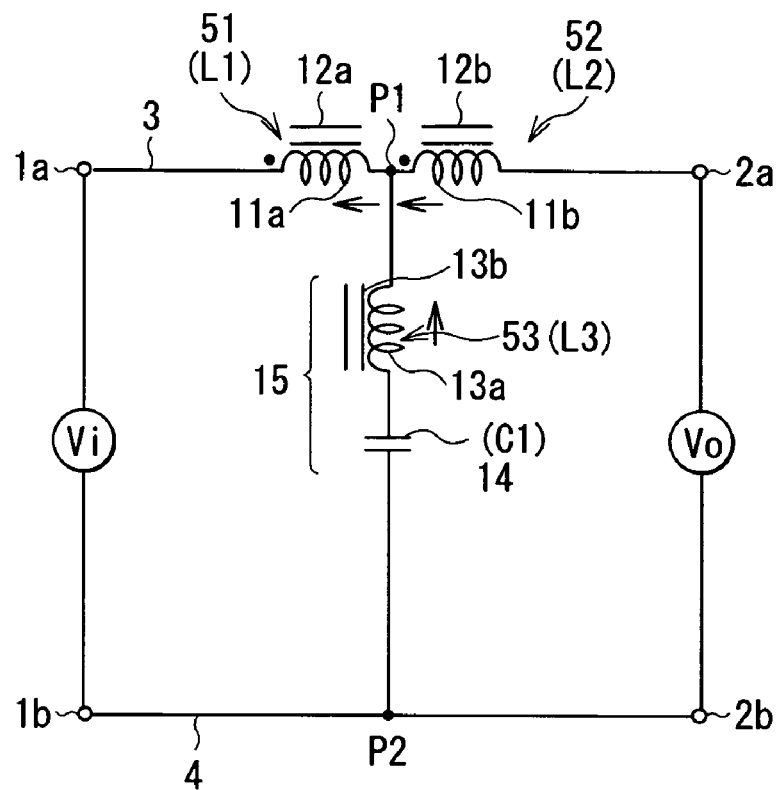
FIG. 1A is a circuit diagram showing a first configuration example of a noise suppression circuit according to a first embodiment of the invention.
Figure 1B:
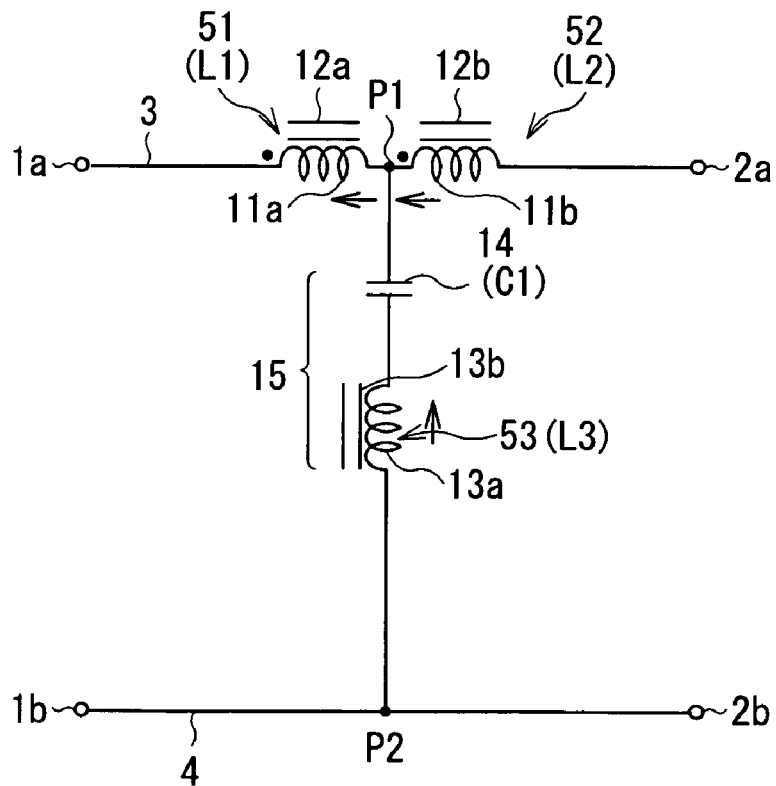
FIG. 1B is a circuit diagram showing a second configuration example of the noise suppression circuit according to the first embodiment of the invention.

FIGS. 1A and 1B show first and second configuration examples of the noise suppression circuit according to the first embodiment. The noise suppression circuit has a pair of terminals 1a and 1b, another pair of terminals 2a and 2b, a first conductive line 3 connecting the terminals 1a and 2a, and a second conductive line 4 connecting the terminals 1b and 2b. The noise suppression circuit further includes first and second inductors 51 and 52 inserted in series in the first conductive line 3. The noise suppression circuit also includes a series circuit 15 of a third inductor 53 and a first capacitor 14 which are connected in series. One end of the series circuit 15 is connected to a junction of the first and second inductors 51 and 52, and the other end is connected to the second conductive line 4.

A connection part in which one end of the series circuit 15 is connected to the first and second inductors 51 and 52 is called a first end P1, and a connection part in which the other end is connected to the second conductive line 4 is called a second end P2. The end opposite to the first end P1 in the first inductor 51 is called one end of the first inductor 51, and the first end P1 side in the first inductor 51 is called the other end of the first inductor 51. The first end P1 side in the second inductor 52 is called one end of the second inductor 52, and the end opposite to the first end P1 in the second inductor 52 is called the other end of the second inductor 52.

In the series circuit 15, the third inductor 53 has a winding 13a wound around a core 13b. In the series circuit 15, the first capacitor 14 functions as a high pass filter for passing a normal-mode signal whose frequency is equal to or higher than a predetermined value.

In the series circuit 15, the positional relation of the third inductor 53 and the first capacitor 14 is not limited. FIG. 1A shows a configuration example in which the third inductor 53 is disposed closer to the first end P1 than the first capacitor 14, and the first capacitor 14 is disposed in a position closer to the second end P2. On the contrary, FIG. 1B shows a configuration example in which the first capacitor 14 is disposed in a position closer to the first end P1, and the third inductor 53 is disposed in a position closer to the second end P2.

The first and second inductors 51 and 52 are electromagnetically coupled to each other. The first inductor 51 has a winding 11a wound around a core 12a. The second inductor 52 has a winding 11b wound around a core 12b. In the diagram, the black dot shown for each of the windings indicates the polarity of the winding and the direction of winding. As shown in the diagram, the polarities of the first and second inductors 51 and 52 are the same.

Figure 2:
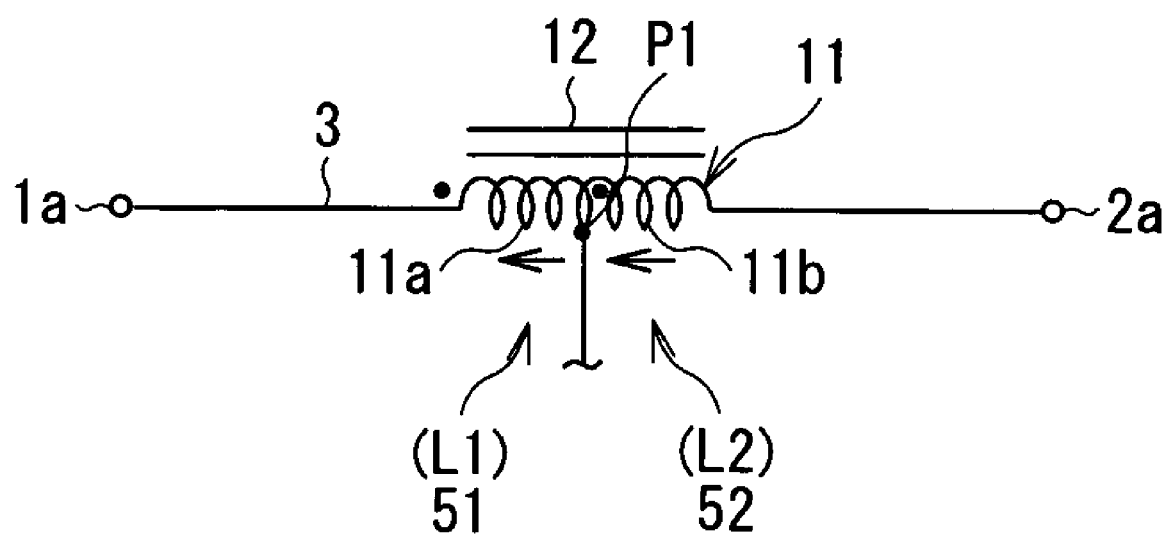
FIG. 2 is a diagram showing an actual configuration example of first and second inductors.

The first and second inductors 51 and 52 may be formed by the different windings 11a and 11b as described above. Alternatively, they can be formed by the single winding 11 as shown in FIG. 2. The winding 11 is wound around a core 12. In FIG. 2, the circuits other than the first and second inductors 51 and 52 are not shown.

In the case of forming the first and second inductors 51 and 52 by a single winding, for example, it is sufficient to provide, as shown in FIG. 2, a connection point (the first end P1) in some midpoint of the single winding 11 and make a portion from one end of the winding 11 to the connection point as the winding 11a, thereby forming the first inductor 51. Similarly, it is also sufficient to form the second inductor 52 by using a portion from the other end of the winding 11 to the connection point as the winding 11b. One end of the series circuit 15 is connected to the connection point.

Preferably, the inductances of the first and second inductors 51 and 52 are the same value. In the case of forming the first and second inductors 51 and 52 by the single winding 11, for example, by providing the connection point at the middle point of the single winding 11, the inductances can be made equal to each other.

As described above, the first and second inductors 51 and 52 are electromagnetically coupled to each other, and the coupling coefficient "k" is ideally 1. However, in practice, the coupling coefficient of 1 cannot be realized. Even when the coupling state is relatively good, the coupling coefficient is 0.998 or the like. Further, the coupling coefficient is influenced by the material of the core, the number of turns, the winding direction, and the like. When the coupling state is bad, the coupling coefficient drops to about 0.4. For example, the smaller the number of turns is, the smaller the coupling coefficient is. The lower the magnetic permeability of the core is, the smaller the coupling coefficient is. In this case, when the values of circuit elements are determined by regarding the coupling coefficient as 1, a problem occurs such that an initially expected attenuation cannot be obtained.

It is therefore preferable to determine the values of the circuit elements in accordance with the actual value of the coupling coefficient. In the noise suppression circuit according to the embodiment, in consideration of the fact that the value of the coupling coefficient "k" between the first and second inductors 51 and 52 becomes lower than 1 in practice, the inductance L3 of the third inductor 53 is set to the value of the actual coupling coefficient "k" so that a desired noise attenuation characteristic is realized on condition that the coupling coefficient "k" is smaller than 1. A change in the attenuation characteristic which occurs as the coupling coefficient drops and a method of determining the value of the inductance L3 in consideration of the change will be described in detail later.

The action of the noise suppression circuit according to the embodiment will now be described on the basis of the configuration example of FIG. 1A. First, as shown in FIG. 1A, the case where a voltage Vi in the normal mode is applied across the terminals 1a and 1b will be described. In this case, the voltage Vi is applied across one end of the first inductor 51 and the second end P2. The voltage Vi is divided by the first inductor 51 and the series circuit 15, and predetermined voltages in the same direction are generated across both ends of the first inductor 51 and across both ends of the series circuit 15. Each of the arrows in the diagram shows that the potential at the pointing side is higher. Since the first inductor 51 and the second inductor 52 are electromagnetically coupled to each other, a predetermined voltage is generated across both ends of the second inductor 52 in accordance with the voltage generated across both ends of the first inductor 51. One end of the series circuit 15 is connected to a junction of the first and second inductors 51 and 52, so that the direction of the voltage generated across both ends of the second inductor 52 becomes opposite to that of the voltage generated across both ends of the series circuit 15, and the voltages cancel out each other. As a result, a voltage across the other end of the second conductive line 52 and the second end P2, that is, a voltage Vo across the terminals 2a and 2b becomes smaller than the voltage Vi applied across one end of the first inductor 51 and the second end P2.

In the embodiment, also in the case where a voltage in the normal mode is applied across the terminals 2a and 2b, the voltage across the terminals 1a and 1b is smaller than the voltage applied across the terminals 2a and 2b in a manner similar to the above. As described above, the noise suppression circuit of the embodiment can suppress normal mode noise in both of the case where normal mode noise occurs in the terminals 1a and 1b and the case where normal mode noise occurs in the terminals 2a and 2b.

Next, particularly, the action in an ideal state will be described. The ideal state in the noise suppression circuit according to the embodiment is a state in which device values are optimized on assumption that the coupling coefficient k between the first and second inductors 51 and 52 is equal to 1. In particular, the inductances L1 and L2 of the first and second inductors 51 and 52 are set to the same value L0 and the inductance L3 of the third inductor 53 is also set to the same value L0. It is assumed that the impedance of the capacitor 14 is zero.

In this case, when the voltage Vi in the normal mode is applied across the terminals 1a and 1b, the voltage Vi is divided by the first and third inductors 51 and 53, and the voltage of ½Vi in the same direction is generated across both ends of the first inductor 51 and across both ends of the third inductor 53. According to the voltage ½Vi generated across both ends of the first inductor 51, the voltage ½Vi is generated also across both ends of the second inductor 52. As a result, since the voltage ½Vi across both ends of the second inductor 52 and the voltage ½Vi across both ends of the third inductor 53 are in the directions opposite to each other, the voltages cancel out each other, and the voltage Vo across the terminals 2a and 2b becomes zero in theory. In the case where the voltage Vi in the normal mode is applied across the terminals 2a and 2b, in a manner similar to the above, the voltage across the terminals 1a and 1b becomes zero in theory.

The case where the inductances L1 and L2 of the first and second inductors 51 and 52 and the inductance L3 of the third inductor 53 are L0 and equal to each other will be examined. For example, this can be realized by making the windings 11a and 11b of the first and second inductors 51 and 52 and the winding 13a of the third inductor 53 equal to each other. In this case, the inductance of the winding is proportional to the square of the winding, so that the inductance of the total winding 11 obtained by combining the windings 11a and 11b is four times as large as the inductance L3 of the third inductor 53. In other words, the inductance L3 of the third inductor 53 is a quarter of the inductance of the winding 11. As described above, the third inductor 53 may have small inductance in the ideal state.

Figure 3:
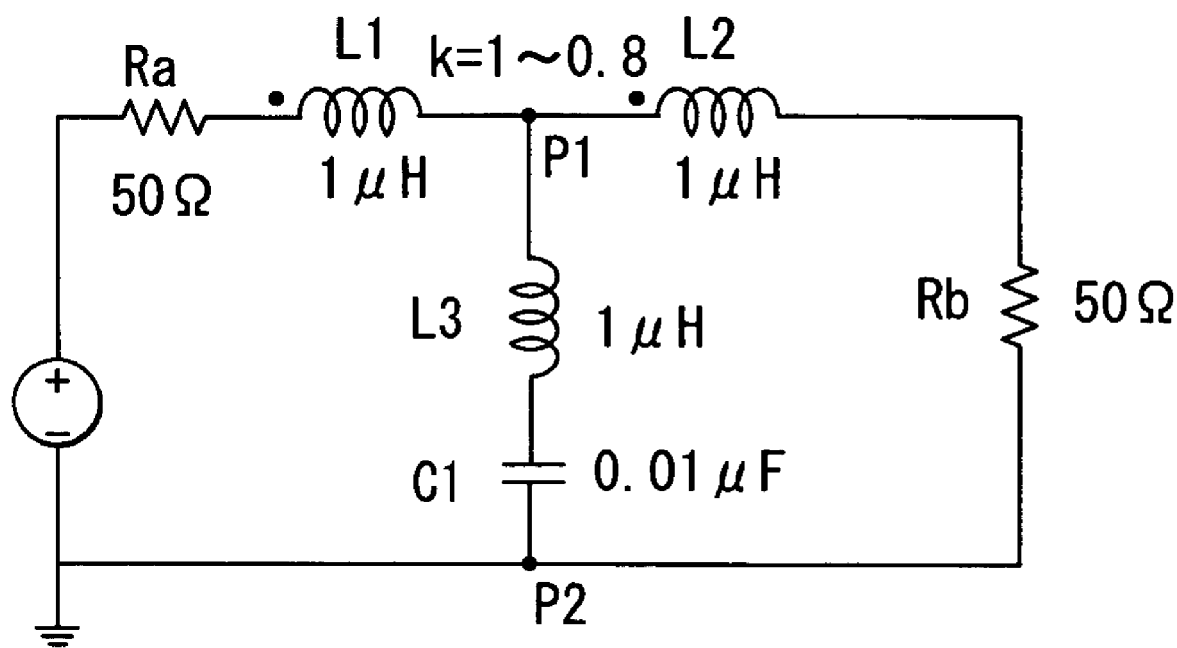
FIG. 3 is a diagram showing a circuit configuration used for first simulation for obtaining characteristics of the noise suppression circuit according to the first embodiment of the invention.

Next, a change in the attenuation characteristic caused by decrease in the coupling coefficient will be concretely described by using results of the following first simulation. FIG. 3 shows an equivalent circuit of the noise suppression circuit used for the first simulation. Ra and Rb are set as input/output impedances. For example, Ra corresponds to an input/output impedance on the power system side, and Rb corresponds to an input/output impedance on the device side. In the simulation, the Rb side is set as a measuring device side. In FIG. 3, the values of circuit elements used for the simulation are shown near circuit reference symbols. As shown in the diagram, the inductances L1 and L2 of the first and second inductors 51 and 52 and the inductance L3 of the third inductor 53 were set to the same value (1 µH). In such a circuit, the attenuation characteristic was calculated while the value of the coupling coefficient k between the first and second inductors 51 and 52 is sequentially decreased to 1 to 0.8 as an ideal value.

Figure 4:
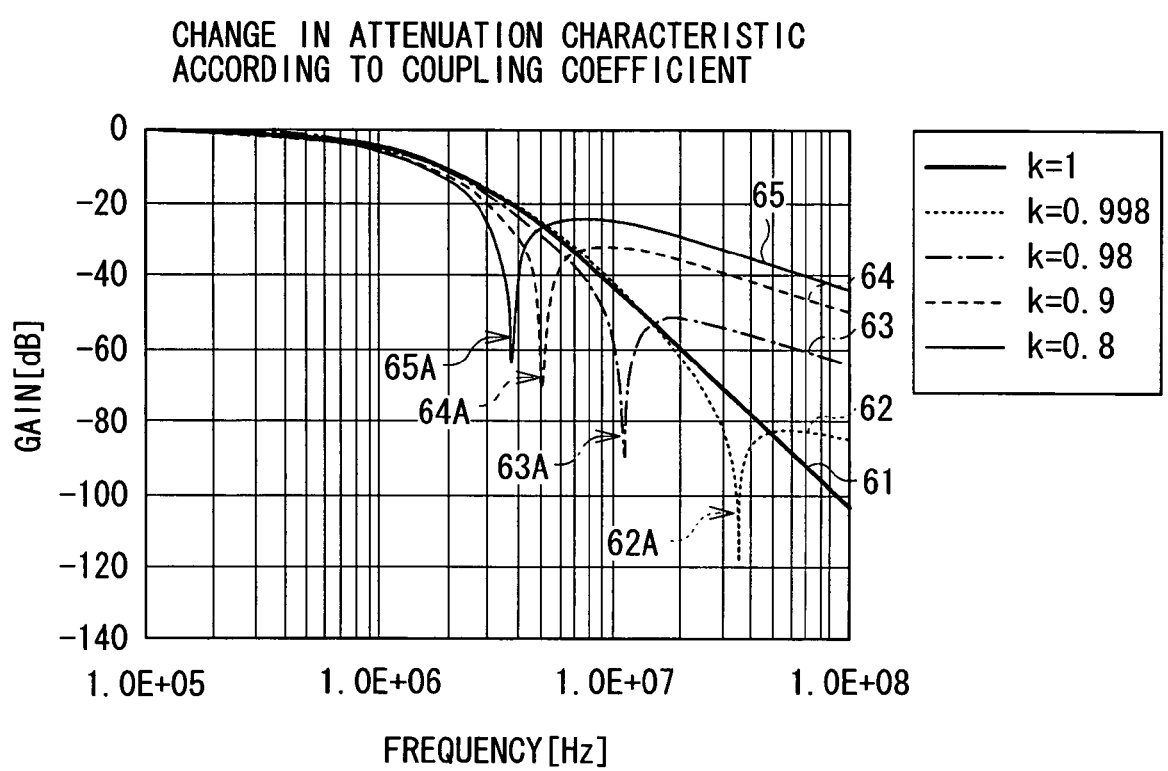
FIG. 4 is a characteristic diagram showing the result of the first simulation.

FIG. 4 shows the results of the simulations and is the plot of frequency characteristics of the attenuation of the normal mode noise in the noise suppression circuit. In FIG. 4, the axis of abscissa indicates frequency (Hz), and the axis of ordinate expresses gain (dB). The smaller the gain is, that is, the larger the absolute value of the gain in the negative direction is, the larger the attenuation of noise is. FIG. 4 shows the results of the simulations. The line indicated by reference numeral 61 shows the case where the coupling coefficient k is 1. The line indicated by reference numeral 62 shows the case where the coupling coefficient k is 0.998. The line indicated by reference numeral 63 shows the case where the coupling coefficient k is 0.98. The line indicated by reference numeral 64 shows the case where the coupling coefficient k is 0.9. The line indicated by reference numeral 65 shows the case where the coupling coefficient k is 0.8.

It is understood from FIG. 4 that the attenuation characteristic having no attenuation pole is obtained in the ideal state (k=1) and, on the other hand, in the case where k is smaller than 1, attenuation poles 62A to 65A are generated. The attenuation pole corresponds to a resonance point formed by the mutual inductance of the first and second inductors 51 and 52, the third inductor 53, and the first capacitor 14. The resonance point moves to the lower frequency side as the value of the coupling coefficient k decreases. It causes a problem such that as the value of the coupling coefficient k decreases, the attenuation initially expected cannot be obtained on the higher frequency side than the resonance point as compared with the attenuation in the ideal state.

In the noise suppression circuit according to the embodiment, therefore, even when the coupling coefficient k is smaller than 1, by adjusting the value of the inductance L3 of the third inductor 53 in accordance with the value of the coupling coefficient k, the attenuation characteristic which is almost the same as or similar to that in the ideal state can be obtained. Alternatively, by forming the resonance point at an arbitrary frequency, a characteristic which is more excellent than that in the ideal state can be partly obtained.

Figure 5:
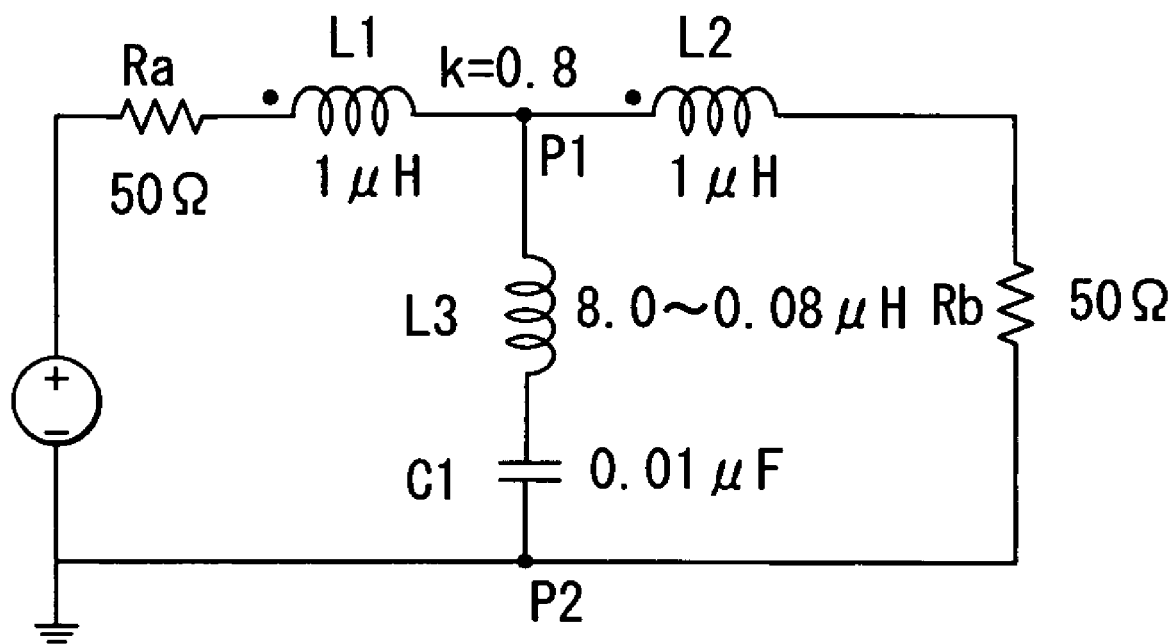
FIG. 5 is a diagram showing a circuit configuration used for second simulation for obtaining characteristics of the noise suppression circuit according to the first embodiment of the invention.

Next, a change in the attenuation characteristic by the value of the inductance L3 will be concretely described using the results of the following second simulation. FIG. 5 shows an equivalent circuit of the noise suppression circuit used for the second simulation. In the circuit, the coupling coefficient k was set as 0.8, and the attenuation characteristic was calculated while variously changing the value of the inductance L3. The values of the other circuit elements are similar to those of the circuit of FIG. 3.

Figure 6:
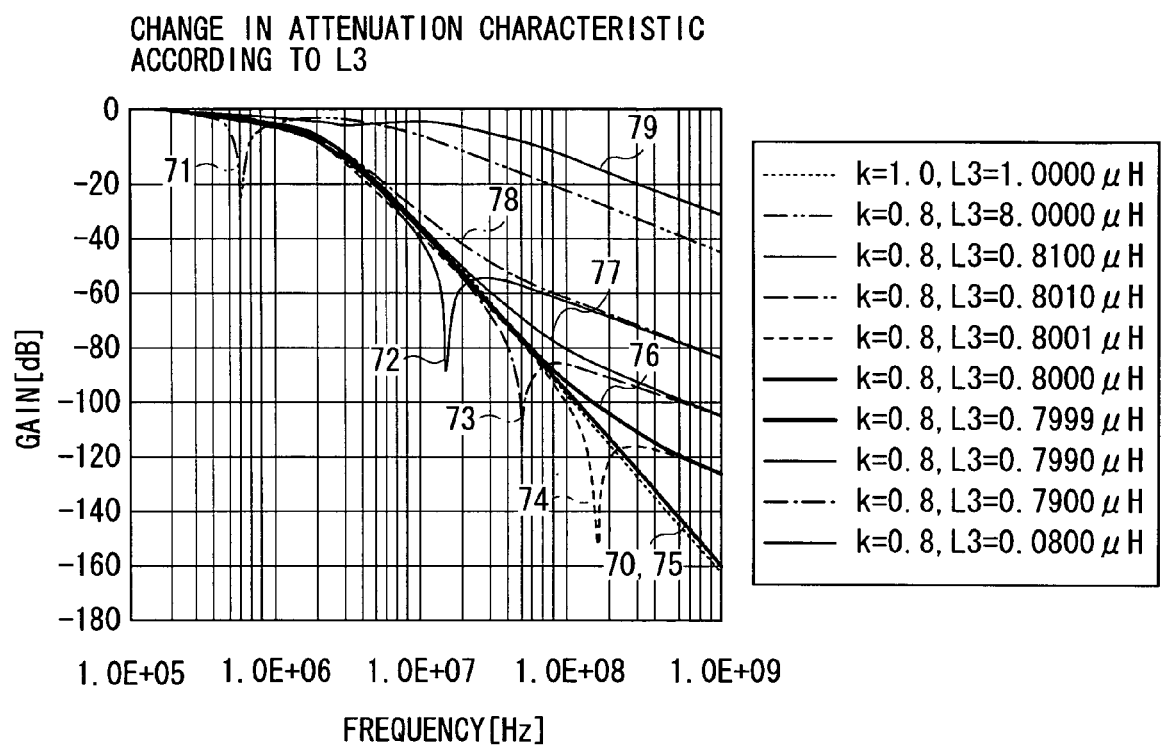
FIG. 6 is a characteristic diagram showing the result of the second simulation.

FIG. 6 shows the results of the simulations and is the plot of frequency characteristics of the attenuation of the normal mode noise in a manner similar to FIG. 4. FIG. 6 also shows results of the calculation in the ideal state (k=1, L3=1 µH) for comparison. FIG. 6 shows the results of the simulations. The line indicated by reference numeral 70 shows the case of the ideal state. The line indicated by reference numeral 71 shows the case where L3=8.0 µH. The line indicated by reference numeral 72 shows the case where L3=0.81 µH. The line indicated by reference numeral 73 shows the case where L3=0.801 µH. The line indicated by reference numeral 74 shows the case where L3=0.8001 µH. The line indicated by reference numeral 75 shows the case where L3=0.8 µH. The line indicated by reference numeral 76 shows the case where L3=0.7999 µH. The line indicated by reference numeral 77 shows the case where L3=0.799 µH. The line indicated by reference numeral 78 shows the case where L3=0.79 µH. The line indicated by reference numeral 79 shows the case where L3=0.08 µH.

From the results of the simulations of FIG. 6, the relation between the value of the inductance L3 and the attenuation characteristic can be described as follows. First, the case where L1=L2=L0 will be described. According to the value of the inductance L3, the results are roughly divided into the following three conditions (A) to (C).

(A) In the case where L3=k×L0

In the simulation of FIG. 6, the case corresponds to the line indicated by reference numeral 75 (L3=0.8×1.0 µH=0.8 µH). In this case, even when k is less than 1, the attenuation characteristic almost the same as that in the ideal state (k=1.0, L3=L0) can be obtained.

(B) In the case where L3>k×L0

In the simulation of FIG. 6, the case corresponds to the lines indicated by reference numerals 71 to 74 (L3>0.8 µH). In this case, a resonance point which does not exist in the ideal state appears. The resonance frequency f0 is obtained as follows.

$$f0 = 1/2\pi \sqrt{C(L3-k \times L0)}$$

$\sqrt{}$ denotes the square root of $C(L3-k \times L0)$. C denotes capacitance of the first capacitor 14 of the series circuit 15. Therefore, in this case, by changing the value of L3, the resonance frequency can be moved to arbitrary frequency. In the case of providing the resonance point, a region in which the attenuation characteristic is better than that in the ideal state is created, partly in the frequency region higher than the cutoff frequency. In other words, as understood also from FIG. 6, in the frequency band higher than the cutoff frequency and before it matches the characteristic in the ideal state, a region in which the attenuation characteristic is better than that in the ideal state is created.

In this case, on the basis of a desired condition that the resonance frequency f0 derived by the above equation is equal to or higher than the cutoff frequency in the ideal state, the maximum value of the inductance L3 desirably satisfies the following expression.

$$L3 \leq (1/2 + 3/2 k) \times L0 \qquad (2a)$$

In the simulation of FIG. 6, the lines indicated by the reference numerals 72 to 74 satisfy the desirable condition (L3≦1.7 µH).

(C) In the case where L3<k×L0

In the simulation of FIG. 6, the lines indicated by the reference numerals 76 to 79 satisfy the condition (L3<0.8 µH). In this case, as understood also from the attenuation characteristic of FIG. 6, the characteristic similar to that in the ideal state is obtained. In particular, the characteristic almost the same as that in the ideal state is displayed to a certain frequency and, at a certain frequency or higher frequencies, the attenuation characteristic deteriorates. Consequently, if the circuit is used in the frequency range almost the same as that in the ideal state, there is an advantage when L3 is set to the conditional value.

In this case, the desirable minimum value of the inductance L3 is obtained as follows from the simulation.

$$L3 \geq 0.9k(L1 \times L2)^{1/2} \qquad (3a)$$

In the simulation of FIG. 6, the lines indicated by reference numerals 76 to 78 satisfy the desirable condition (L3≧0.72 µH).

Figure 7:
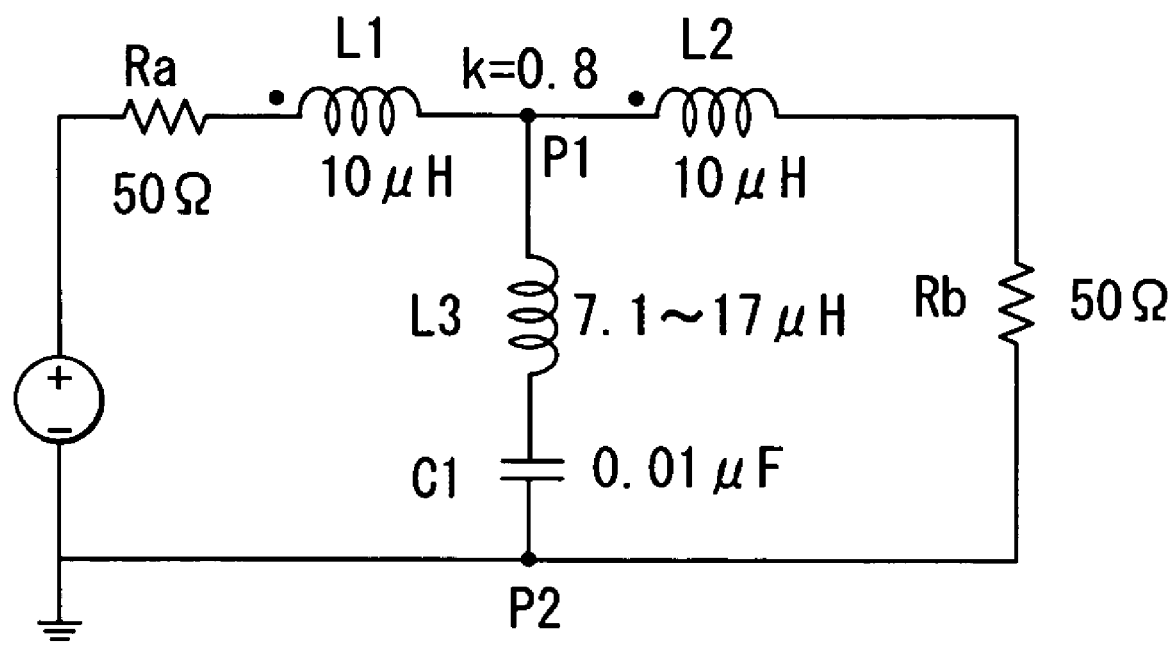
FIG. 7 is a diagram showing a circuit configuration used for third simulation for obtaining characteristics of the noise suppression circuit according to the first embodiment of the invention.

The characteristics at the maximum and minimum values of the inductance L3 obtained by the equations (2a) and (3a) were calculated by simulation. FIG. 7 shows an equivalent circuit of the noise suppression circuit used for the simulation. In the equivalent circuit, both of the inductances L1 and L2 of the first and second inductors 51 and 52 were set to L0=10 μH. The coupling coefficient k was set to 0.8. The maximum value of the inductance L3 obtained from the equation (2a) is as follows.

$$L3=(\frac{1}{2}+\frac{3}{2}\times k)\times L0=17 \text{ μH}$$

The minimum value of the inductance L3 obtained from the equation (3a) is as follows.

$$L3=0.9k\times L0=7.2 \text{ μH}$$

The attenuation characteristic in the case where the inductance L3 was set to the maximum and minimum values was calculated.

Figure 8:
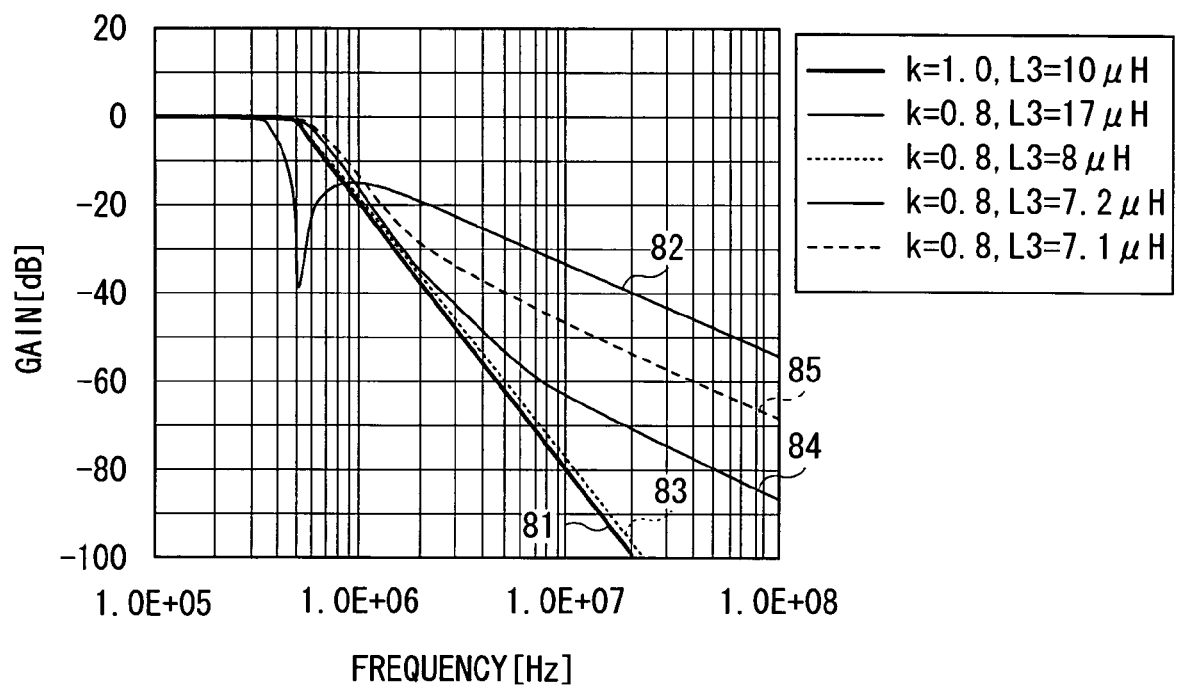
FIG. 8 is a characteristic diagram showing the result of the third simulation.

FIG. 8 shows results of the simulation. For comparison, simulations were also conducted with respect to the case of the ideal state (k=1.0, L3=10 μH) and the case of the condition (A) (k=0.8, L3=k×L0=8 μH). A simulation was also performed with respect to the case where the inductance L3 was set to 7.1 μH which is slightly smaller than the minimum value. FIG. 8 shows results of the simulations in which the line indicated by reference numeral 81 shows the case of the ideal state, the line indicated by reference numeral 82 shows the case where L3=17 μH, the line indicated by the reference numeral 83 shows the case where L3=8 μH, the line shown by the reference numeral 84 shows the case where L3=7.2 μH, and the line shown by the reference numeral 85 shows the case where L3=7.1 μH. From the results of FIG. 8, it was confirmed that the maximum and minimum values were appropriate.

Although the case where L1=L2 has been described above, the case where L1 and L2 are different from each other is similar as described below. The case is roughly classified to the following three conditions (A-1), (B-1), and (C-1).

(A-1) In the case where $L3=k(L1\times L2)^{1/2}$

In this case, in a manner similar to the case of the condition (A), even when k is less than 1, the attenuation characteristic almost the same as that in the case where k=1.0 can be obtained.

(B-1) In the case where $L3>k(L1\times L2)^{1/2}$

In this case, a resonance point which does not exist when k=1.0 appears in a manner similar to the case of the condition (B), and an attenuation characteristic similar to that under the condition (B) is obtained. The resonance frequency f0 is obtained as follows.

$$f0=\frac{1}{2\pi}\sqrt{C(L3-M)}$$

where $M=k(L1\times L2)^{1/2}$

√ denotes the square root of C(L3−M). C denotes capacitance of the first capacitor 14 of the series circuit 15. In this case as well, a region in which the attenuation characteristic is better than that in the ideal state is created in the frequency band of frequencies higher than the cutoff frequency and before it matches the characteristic in the ideal state.

In this case, on the basis of a desired condition that the resonance frequency f0 derived by the above equation is equal to or higher than the cutoff frequency in the ideal state, the maximum value of the inductance L3 desirably satisfies the following expression.

$$L3\leq(L1+M)(L2+M)/(L1+L2+2M)+M \quad (1)$$

(C-1) In the case where $L3<k(L1\times L2)^{1/2}$

In this case, in a manner similar to the case under the condition (C), the characteristic almost the same as that in the ideal state is displayed to a certain frequency and, at a certain frequency or higher frequencies, the attenuation characteristic deteriorates. In this case, the desirable minimum value of the inductance L3 is obtained as follows from the simulation.

$$L3\geq 0.9k(L1\times L2)^{1/2} \quad (2)$$

As described above, the inductance L3 is set according to the value of the coupling coefficient k. It is consequently necessary to preliminarily measure the value of the coupling coefficient k to determine the value of the inductance L3. Next, a method of measuring the coupling coefficient k will be described.

Generally, the self inductances L1 and L2 of two coils and the mutual inductance M have the following relation.

$$M=k(L1\times L2)^{1/2}$$

Therefore, by measuring the self inductances L1 and L2 of the two coils and the mutual inductance M from the equation, the coupling coefficient k can be obtained.

Figure 14:
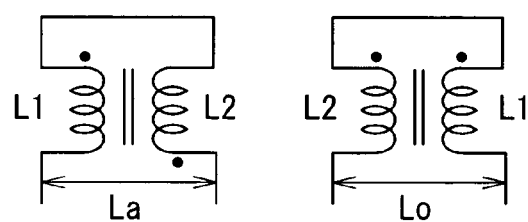
FIG. 14 is a diagram for explaining a method of measuring coupling coefficient.

FIG. 14 shows an example of the method of measuring the mutual inductance M. As shown in FIG. 14, La and Lb are measured with respect to each of the case where two coils are connected in series and in phase and the case where two coils are connected in series and in opposite phase. In this case, the mutual inductance M can be obtained by the following equation. Each of La and Lb shows an inductance between terminals.

$$M=(La-Lb)/4$$

The measuring methods are written, for example, in "Impedance Measurement Handbook" of Ajilent Technologies.

As described above, the noise suppression circuit of the embodiment can effectively suppress normal mode noise in a wide frequency range with a relatively simple configuration and, moreover, without using a coil having a large inductance. In particular, the inductance L3 in the series circuit 15 is set to a proper value in accordance with the value of the coupling coefficient k, so that the frequency characteristic of the noise attenuation can be obtained, which is almost the same as or similar to that in the ideal state or partly more excellent than that in the ideal state.

SECOND EMBODIMENT

A noise suppression circuit according to a second embodiment of the invention will now be described. The noise suppression circuit according to the first embodiment is an imbalance-type circuit in which an inductor is inserted in only the first conductive line 3 as one of the two conductive lines 3 and 4. The noise suppression circuit according to the second embodiment is a balance-type circuit by inserting the inductor in both of the two conductive lines 3 and 4.

Figure 9A:
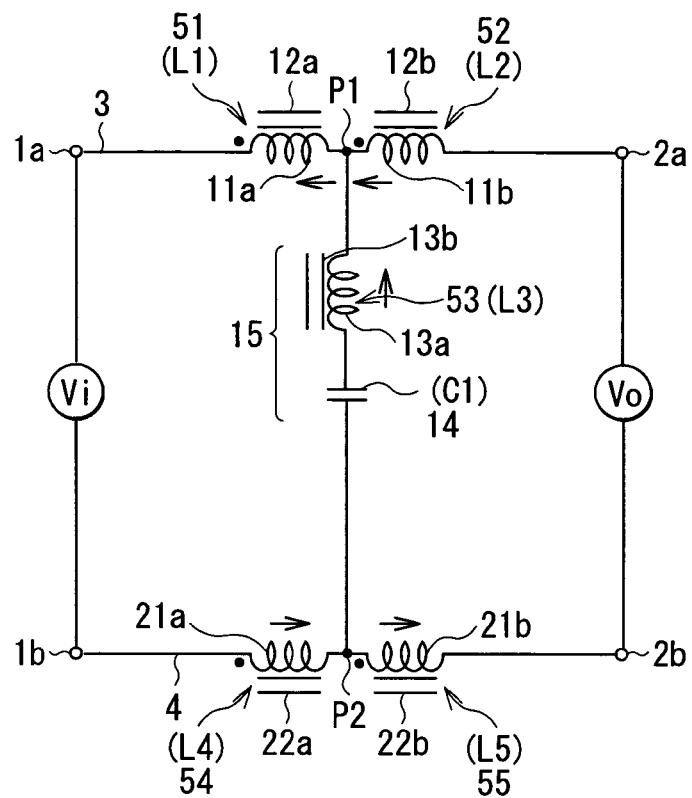
FIG. 9A is a circuit diagram showing a first configuration example of a noise suppression circuit according to a second embodiment of the invention.
Figure 9B:
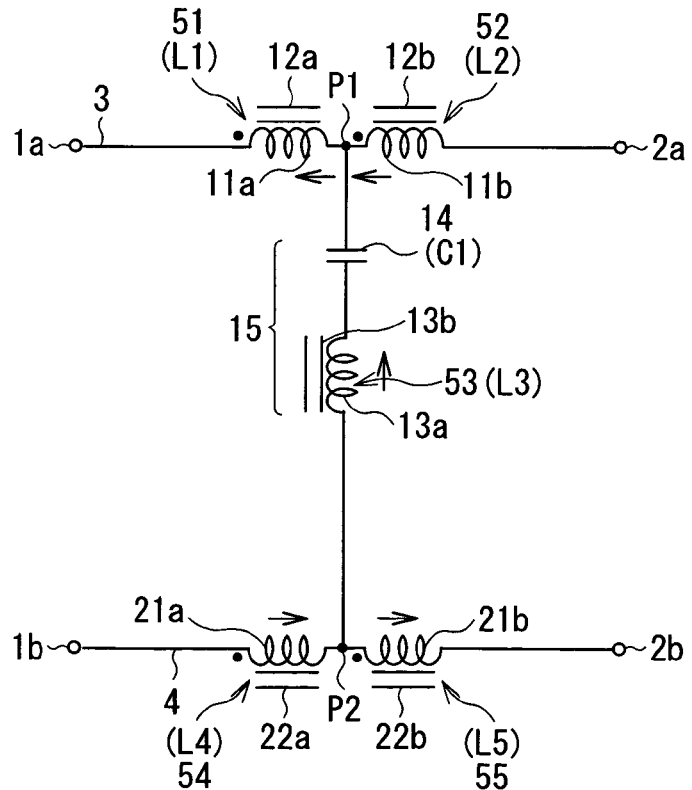
FIG. 9B is a circuit diagram showing a second configuration example of the noise suppression circuit according to the second embodiment of the invention.

FIGS. 9A and 9B show first and second configuration examples of the noise suppression circuit according to the second embodiment of the invention. The noise suppression circuits of FIGS. 9A and 9B are obtained by adding fourth and fifth inductors 54 and 55 to the configurations of the noise suppression circuits of FIGS. 1A and 1B. The other configuration is similar to that of the noise suppression circuits of FIGS. 1A and 1B. The fourth and fifth inductors 54 and 55 are inserted in series in the second conductive line 4.

In the noise suppression circuits according to the second embodiment, a connection part in which one end of the series circuit 15 is connected to the first and second inductors 51 and 52 is called the first end P1, and a connection part in which the other end is connected to the fourth and fifth inductors 54 and 55 is called the second end P2. The end opposite to the first end P1 in the first inductor 51 is called one end of the first inductor 51, and the end on the first end P1 side in the first inductor 51 is called the other end of the first inductor 51. The first end P1 side in the second inductor 52 is called one end of the second inductor 52, and the end opposite to the first end P1 in the second inductor 52 is called the other end of the second inductor 52. The end opposite to the second end P2 in the fourth inductor 54 is called one end of the fourth inductor 54, and the end on the second end P2 side in the fourth inductor 54 is called the other end of the fourth inductor 54. The end on the second end P2 side in the fifth inductor 55 is called one end of the fifth inductor 55, and the end opposite to the second end P2 in the fifth inductor 55 is called the other end of the fifth inductor 55.

Also in the noise suppression circuits of the second embodiment, in the series circuit 15, the positional relation of the third inductor 53 and the first capacitor 14 is not limited. FIG. 9A shows a configuration example in which the third inductor 53 is disposed closer to the first end P1 than the first capacitor 14, and the first capacitor 14 is disposed in a position closer to the second end P2. On the contrary, FIG. 9B shows a configuration example in which the first capacitor 14 is disposed in a position closer to the first end P1, and the third inductor 53 is disposed in a position closer to the second end P2.

The fourth and fifth inductors 54 and 55 are electromagnetically coupled to each other like the first and second inductors 51 and 52. The fourth inductor 54 has a winding 21*a* wound around a core 22*a*. The fifth inductor 55 has a winding 21*b* wound around a core 22*b*. In the diagram, the black dot shown for each of the windings indicates the polarity of the winding and the direction of winding. The polarities of the first and second inductors 51 and 52 and the fourth and fifth inductors 54 and 55 may be opposite to those shown in the diagrams as long as the relations among the windings are maintained.

Figure 10:
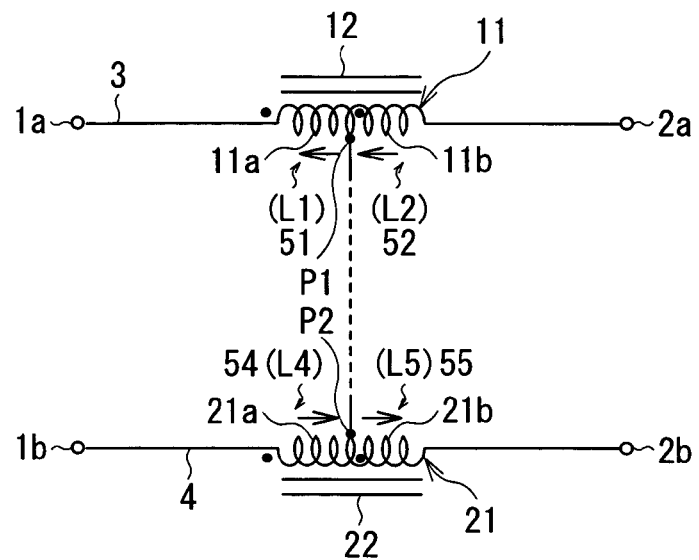
FIG. 10 is a diagram showing an actual configuration example of first and second inductors and fifth and sixth inductors.

Like the first and second inductors 51 and 52, the fourth and fifth inductors 54 and 55 may be formed by the different windings 22*a* and 22*b*. Alternatively, they can be formed by the single winding 21 as shown in FIG. 10. The winding 21 is wound around the core 22. In FIG. 10, the circuits other than the first and second inductors 51 and 52 and the fourth and fifth inductors 54 and 55 are not shown.

In the case of forming the fourth and fifth inductors 54 and 55 by a single winding, as shown in FIG. 10, for example, it is sufficient to provide a connection point (the second end P2) in some midpoint of the single winding 21 and make a portion from one end of the winding 21 to the connection point as the winding 21*a*, thereby forming the fourth inductor 54. Similarly, it is also sufficient to form the fifth inductor 55 by using a portion from the other end of the winding 21 to the connection point as the winding 21*b*. The other end of the series circuit 15 is connected to the connection point.

Preferably, the inductances of the fourth and fifth inductors 54 and 55 have the same value like the inductances of the first and second inductors 51 and 52. More preferably, all of the inductances of the first and second inductors 51 and 52 and the fourth and fifth inductors 54 and 55 are the same value. In the case of forming the fourth and fifth inductors 54 and 55 by the single winding 21, for example, by providing the connection point at the middle point of the single winding 21, the inductances of the fourth and fifth inductors 54 and 55 can be made equal to each other.

As described above, the first and second inductors 51 and 52 are electromagnetically coupled to each other, and the coupling coefficient k1 is ideally 1. The coupling coefficient k2 between the fourth and fifth inductors 54 and 55 is also ideally 1. However, in practice, it is difficult to realize the coupling coefficient of 1.

In the noise suppression circuit according to the second embodiment, in consideration of the fact that each of the value of the coupling coefficient k1 between the first and second inductors 51 and 52 and the value of the coupling coefficient k2 between the fourth and fifth inductors 54 and 55 becomes smaller than 1 in practice, the inductance L3 of the third inductor 53 is set to a value according to the actual coupling coefficients k1 and k2 so that a desired noise attenuation characteristic is realized on condition that each of the coupling coefficients k1 and k2 is smaller than 1. A method of determining the value of the inductance L3 will be described in detail later.

The action of the noise suppression circuit according to the second embodiment will now be described on the basis of the configuration example of FIG. 9A. First, as shown in FIG. 9A, the case where the voltage Vi in the normal mode is applied across the terminals 1*a* and 1*b* will be described. In this case, the voltage Vi is applied across one end of the first inductor 51 and one end of the fourth inductor 54. The voltage Vi is divided by the first inductor 51, the series circuit 15, and the fourth inductor 54, and predetermined voltages in the same direction are generated between both ends of the first inductor 51, across both ends of the series circuit 15, and across both ends of the fourth inductor 54. Each of the arrows in the diagram shows that the potential at the pointing side is higher.

Since the first inductor 51 and the second inductor 52 are electromagnetically coupled to each other, a predetermined voltage is generated across both ends of the second inductor 52 in accordance with the voltage generated across both ends of the first inductor 51. Similarly, since the fourth inductor 54 and the fifth inductor 55 are electromagnetically coupled to each other, a predetermined voltage is generated across both ends of the fifth inductor 55 in accordance with the voltage generated across both ends of the fourth inductor 54. One end of the series circuit 15 is connected to a junction of the first and second inductors 51 and 52 and the other end is connected to a junction of the fourth and fifth inductors 54 and 55. Consequently, the direction of the voltage generated across both ends of the second inductor 52 and the direction of the voltage generated across both ends of the fifth inductor 55 become opposite to that of the voltage generated across both ends of the series circuit 15, and the voltages cancel out each other. As a result, a voltage across the other end of the second conductive line 52 and the other end of the fifth inductor 55, that is, the voltage Vo across the terminals 2*a* and 2*b* becomes smaller than the voltage Vi applied across one end of the first inductor 51 and one end of the fourth inductor 54.

In the second embodiment, also in the case where a voltage in the normal mode is applied across the terminals 2*a* and 2*b*, the voltage across the terminals 1*a* and 1*b* is smaller than the voltage applied across the terminals 2*a* and 2*b* in a manner similar to the above. As described above, the noise suppression circuit of the second embodiment can suppress normal mode noise in both of the case where normal mode noise is applied to the terminals 1*a* and 1*b* and the case where normal mode noise applied to the terminals 2*a* and 2*b*.

Next, particularly, the action in an ideal state will be described. The ideal state in the noise suppression circuit according to the second embodiment is a state in which device values are optimized on assumption that the coupling coefficient k1 between the first and second inductors 51 and 52 is equal to 1 and the coupling coefficient k2 between the fourth and fifth inductors 54 and 55 is equal to 1. In particular, the inductances L1 and L2 of the first and second inductors 51 and 52 and the inductances L4 and L5 of the fourth and fifth inductors 54 and 55 are set to the same value L0 and the inductance L3 of the third inductor 53 is set to a value twice as large as L0. It is assumed that the impedance of the capacitor 14 is zero.

In this case, when the voltage Vi in the normal mode is applied across the terminals 1a and 1b, the voltage Vi is divided by the first inductor 51, the series circuit 15, and the fourth inductor 54, a voltage of ¼Vi is generated across both ends of the first inductor 51 and across both ends of the fourth inductor 54, and a voltage of ½Vi is generated across both ends of the series circuit 15. According to the voltage ¼Vi generated across both ends of the first inductor 51, the voltage ¼Vi is generated also across both ends of the second inductor 52. Similarly, according to the voltage ¼Vi generated across both ends of the fourth inductor 54, the voltage ¼Vi is generated also across both ends of the fifth inductor 55. As a result, since the voltage ¼Vi across both ends of the second inductor 52, the voltage ¼Vi across both ends of the fifth inductor 55, and the voltage ½Vi across both ends of the third inductor 53 cancel out each other, the voltage Vo across the terminals 2a and 2b becomes zero in theory. Also in the case where the voltage Vi in the normal mode is applied across the terminals 2a and 2b, in a manner similar to the above, the voltage across the terminals 1a and 1b becomes zero in theory.

Since the value of each of the coupling coefficients k1 and k2 becomes smaller than 1 in practice, in the noise suppression circuit according to the second embodiment, even when each of the coupling coefficients k1 and k2 is smaller than 1, by adjusting the value of the inductance L3 of the third inductor 53 in accordance with the values of the coupling coefficients k1 and k2, the attenuation characteristic which is almost the same as or similar to that in the ideal state can be obtained. Alternatively, by forming the resonance point at an arbitrary frequency, a characteristic which is more excellent than that in the ideal state can be partly obtained.

Figure 11A:
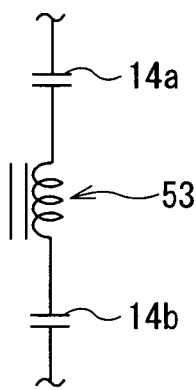
FIG. 11A is a circuit diagram showing a first modification of the noise suppression circuit according to the second embodiment of the invention.
Figure 11B:
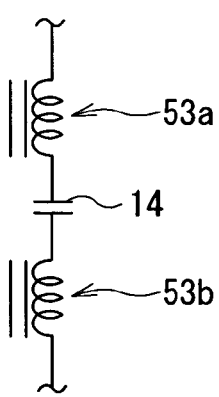
FIG. 11B is a circuit diagram showing a second modification of the noise suppression circuit according to the second embodiment of the invention.

FIGS. 11A and 11B show modifications of the balance-type noise suppression circuits of FIGS. 9A and 9B. Concretely, in the modifications, the degree of balance can be made higher than that of the noise suppression circuits of FIGS. 9A and 9B. The noise suppression circuits of FIGS. 11A and 11B are similar to the noise suppression circuits of FIGS. 9A and 9B except for the series circuit 15, so that the other circuit is not shown. More specifically, the noise suppression circuit of FIG. 11A has a configuration obtained by replacing the series circuit 15 configured by the third inductor 53 and the first capacitor 14 shown in FIGS. 9A and 9B with a configuration in which the third inductor 53 is provided between two capacitors 14a and 14b having the capacitance twice as that of the first capacitor 14. In this case, the inductance L3 of the third inductor 53 in the circuit of FIG. 11A is the same as that of the third inductor 53 shown in FIGS. 9A and 9B. The noise suppression circuit of FIG. 11B is obtained by replacing the series circuit 15 shown in FIGS. 9A and 9B with a configuration in which the first capacitor 14 having the capacitance as that shown in FIGS. 9A and 9B is provided between two inductors 53a and 53b having an inductance which is the half of that of the third inductor 53. With the configurations, the degree of balance can be increased as compared with that of the noise suppression circuits of FIGS. 9A and 9B.

Figure 12:
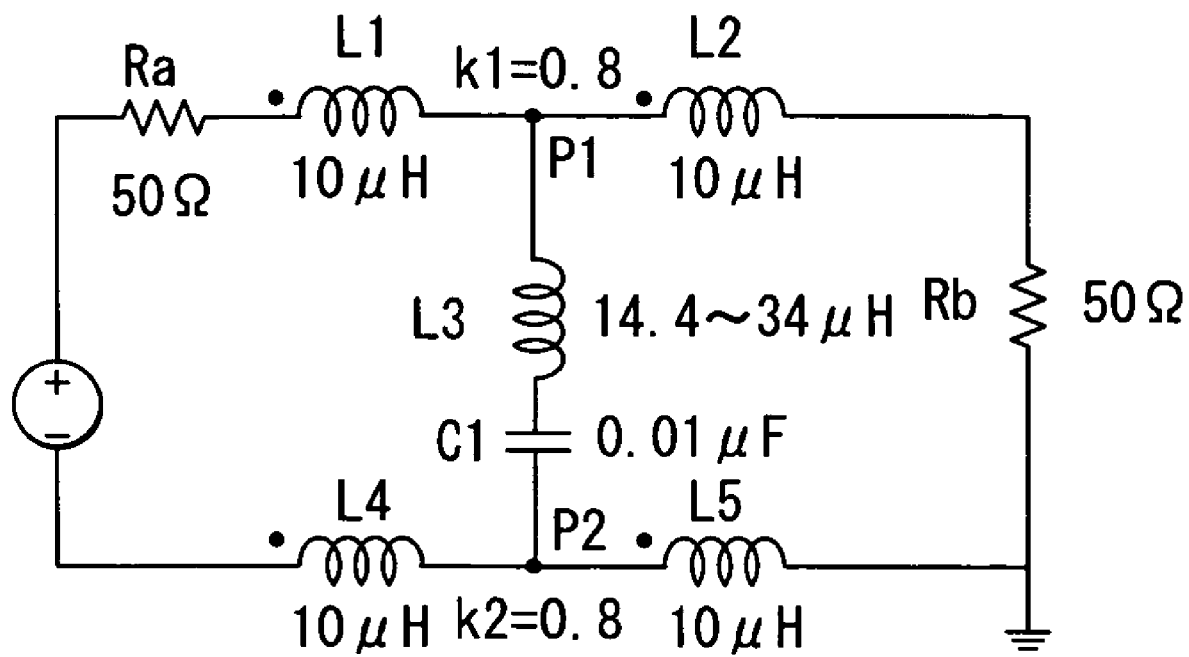
FIG. 12 is a diagram showing a circuit configuration used for simulation for obtaining characteristics of the noise suppression circuit according to the second embodiment of the invention.

Next, a change in the attenuation characteristic by the value of the inductance L3 will be concretely described by using results of the following simulation. FIG. 12 shows an equivalent circuit of the noise suppression circuit used for the simulation. Ra and Rb are set as input/output impedances. In this circuit, the attenuation characteristic was calculated by setting the coupling coefficients k1=k2=0.8 while variously changing the value of the inductance L3. The inductances L1 and L2 of the first and second inductors 51 and 52 and the inductances L4 and L5 of the fourth and fifth inductors 54 and 55 are set to the same value (L0=10 µH).

Figure 13:
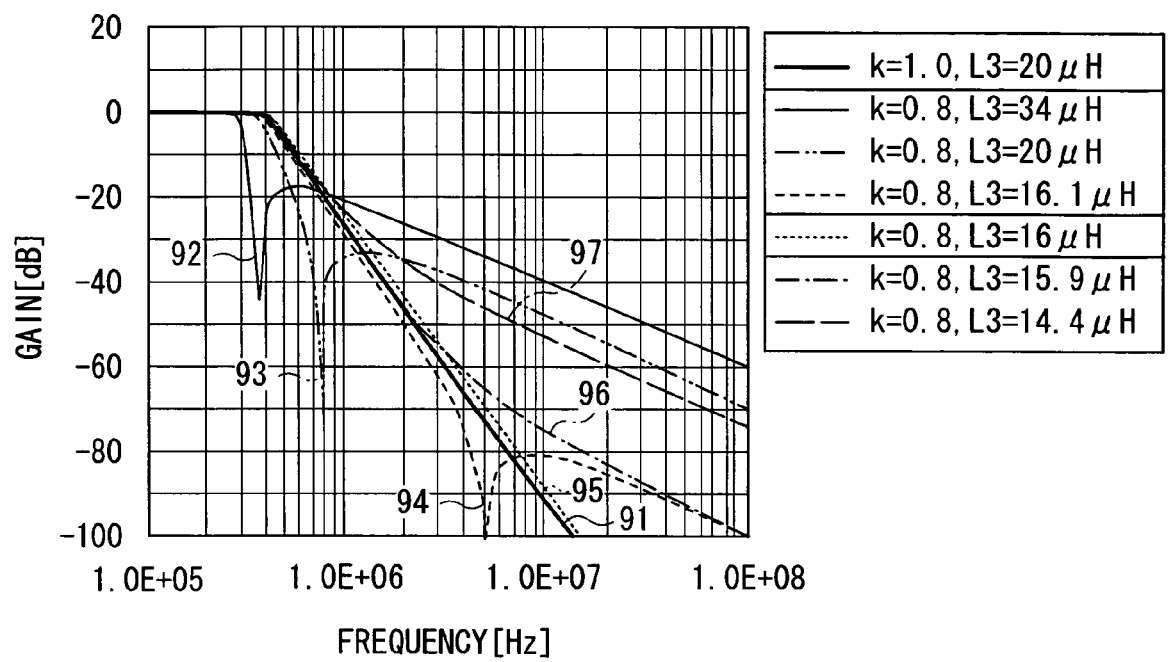
FIG. 13 is a characteristic diagram showing the result of simulation of an attenuation characteristic in the noise suppression circuit according to the second embodiment of the invention.

FIG. 13 shows the results of the simulations and is the plot of frequency characteristics of the attenuation of the normal mode noise in a manner similar to FIG. 6. FIG. 13 also shows the results of the calculation in the ideal state (k=1, L3=2L0=20 µH) for comparison. In FIG. 13, the line indicated by reference numeral 91 shows the case of the ideal state. The line indicated by reference numeral 92 shows the case where L3=34 µH. The line indicated by reference numeral 93 shows the case where L3=20 µH. The line indicated by reference numeral 94 shows the case where L3=16.1 µH. The line indicated by reference numeral 95 shows the case where L3=16 µH. The line indicated by reference numeral 96 shows the case where L3=15.9 µH. The line indicated by reference numeral 97 shows the case where L3=14.4 µH.

From the results of the simulations of FIG. 13, the relation between the value of the inductance L3 and the attenuation characteristic can be described as follows. According to the value of the inductance L3, the results are roughly divided into the following three conditions (A) to (C).

(A) In the case where L3=M1+M2

$$M1 = k1 \times (L1 \times L2)^{1/2} \quad (4\text{-}1)$$

$$M2 = k2 \times (L4 \times L5)^{1/2} \quad (4\text{-}2)$$

In the simulation of FIG. 13, the case corresponds to the line indicated by reference numeral 95 (L3=16 µH). In this case, even when k is less than 1, the attenuation characteristic almost the same as that in the ideal state (k=1.0, L3=2L0) can be obtained.

(B) In the case where L3>M1+M2

In the simulation of FIG. 13, the case corresponds to the lines indicated by reference numerals 92 to 94 (L3>16 µH). In this case, a resonance point which does not exist in the ideal state appears. The resonance frequency f0 is obtained as follows.

$$f0 = 1/2\pi \sqrt{C(L3-M1-M2)}$$

$\sqrt{}$ denotes the square root of $C(L3-M1-M2)$. C denotes capacitance of the first capacitor 14 of the series circuit 15. Therefore, in this case, by changing the value of L3, the resonance frequency can be moved to arbitrary frequency. In the case of providing the resonance point, a region in which the attenuation characteristic is better than that in the ideal state is created, partly in the frequency region higher than the cutoff frequency. In other words, as understood also from FIG. 13, in the frequency band higher than the cutoff frequency and before it matches the characteristic in the ideal state, a region in which the attenuation characteristic is better than that in the ideal state is created.

In this case, on the basis of a desired condition that the resonance frequency f0 derived by the above equation is equal to or higher than the cutoff frequency in the ideal state, the maximum value of the inductance L3 desirably satisfies the following expression.

$$L3 \leq (L1+L4+M1+M2) \times (L2+L5+M1+M2)/\{L1+L2+L4+L5+2\times(M1+M2)\}+M1+M2 \quad (5)$$

In the simulation of FIG. 13, the line indicated by the reference numeral 92 shows the characteristic at the maximum value obtained by the equation (L3=34 µH).

(C) In the case where L3<M1+M2

In the simulation of FIG. 13, the case corresponds to the lines indicated by the reference numerals 96 and 97 (L3<16 µH). In this case, as understood also from the attenuation characteristic of FIG. 13, the characteristic similar to that in the ideal state is obtained. In particular, the characteristic almost the same as that in the ideal state is displayed to a certain frequency and, at a certain frequency or higher frequencies, the attenuation characteristic deteriorates. Consequently, if the circuit is used in the frequency range almost the same as that in the ideal state, there is an advantage when L3 is set to the conditional value.

In this case, the desirable minimum value of the inductance L3 is obtained as follows by the simulation.

$$L3 \geq 0.9 \times (M1+M2) \quad (6)$$

In the simulation of FIG. 13, the line indicated by reference numeral 97 shows the characteristic at the minimum value obtained by the equation (L3=14.4 µH).

As described above, in the noise suppression circuit of the second embodiment, the inductor is inserted in each of the first and second conductive lines 3 and 4 so that the impedance characteristics of the first and second conductive lines 3 and 4 are balanced, so that the degree of balance between the lines can be increased. In particular, the inductance L3 in the series circuit 15 is set to a proper value in accordance with the values of the coupling coefficients k1 and k2, so that the frequency characteristic of the noise attenuation can be obtained, which is almost the same as or similar to that in the ideal state or partly more excellent than that in the ideal state. The other configuration, action, and effect in the second embodiment are similar to those of the first embodiment.

THIRD EMBODIMENT

Figure 15A:
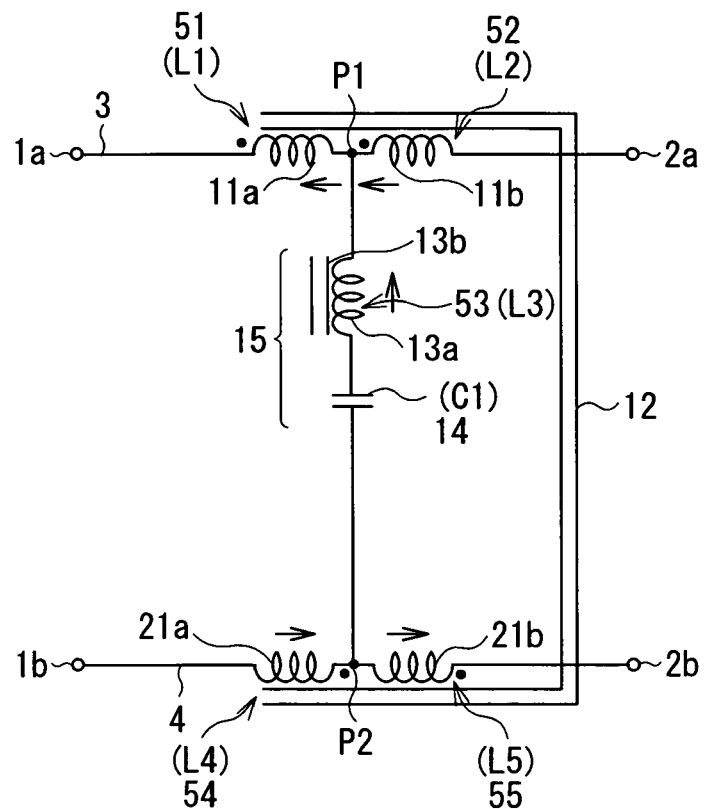
FIG. 15A is a circuit diagram showing a first configuration example of a noise suppression circuit according to a third embodiment of the invention.
Figure 15B:
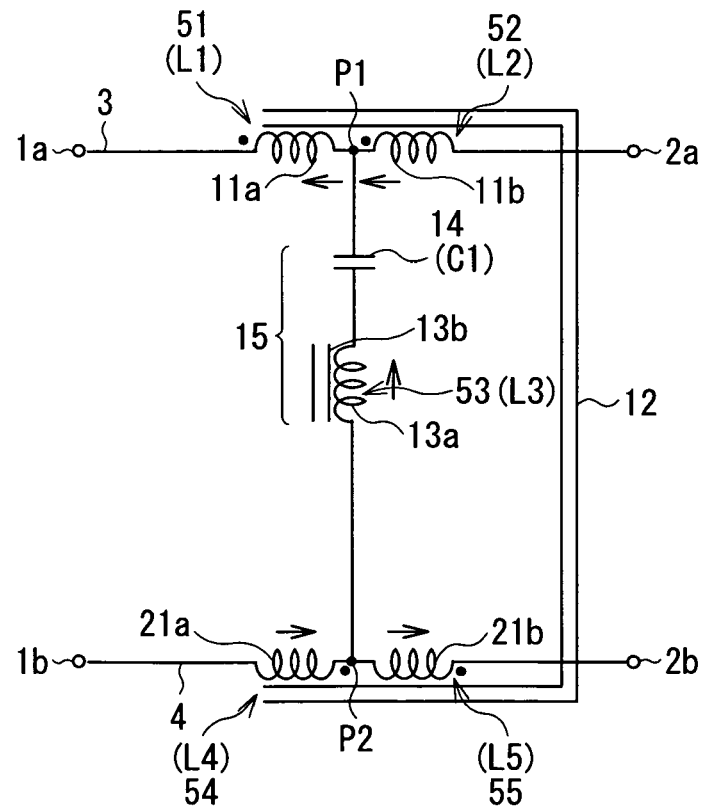
FIG. 15B is a circuit diagram showing a second configuration example of the noise suppression circuit according to the third embodiment of the invention.

A noise suppression circuit according to a third embodiment of the invention will now be described. FIGS. 15A and 15B show first and second configuration examples of the noise suppression circuit according to the third embodiment of the invention. The noise suppression circuits of FIGS. 15A and 15B are obtained by mutually magnetically coupling the first and second inductors 51 and 52 and the fourth and fifth inductors 54 and 55 to each other in the configurations of the noise suppression circuits of FIGS. 9A and 9B in the second embodiment. Except for the difference in the coupling relation, the basic configuration and the noise suppressing operation are similar to those of the noise suppression circuits of FIGS. 9A and 9B.

The first and second inductors 51 and 52 and the fourth and fifth inductors 54 and 55 are mutually magnetically coupled to each other by winding windings of the inductors around, for example, the same core 12. The core 12 may be a split core. In FIGS. 15A and 15B, the black dot shown for each of the windings indicates the polarity of the winding and the direction of winding. The polarities of the first and second inductors 51 and 52 and the fourth and fifth inductors 54 and 55 may be opposite to those shown in the diagrams as long as the relations among the windings are maintained.

Figure 16:
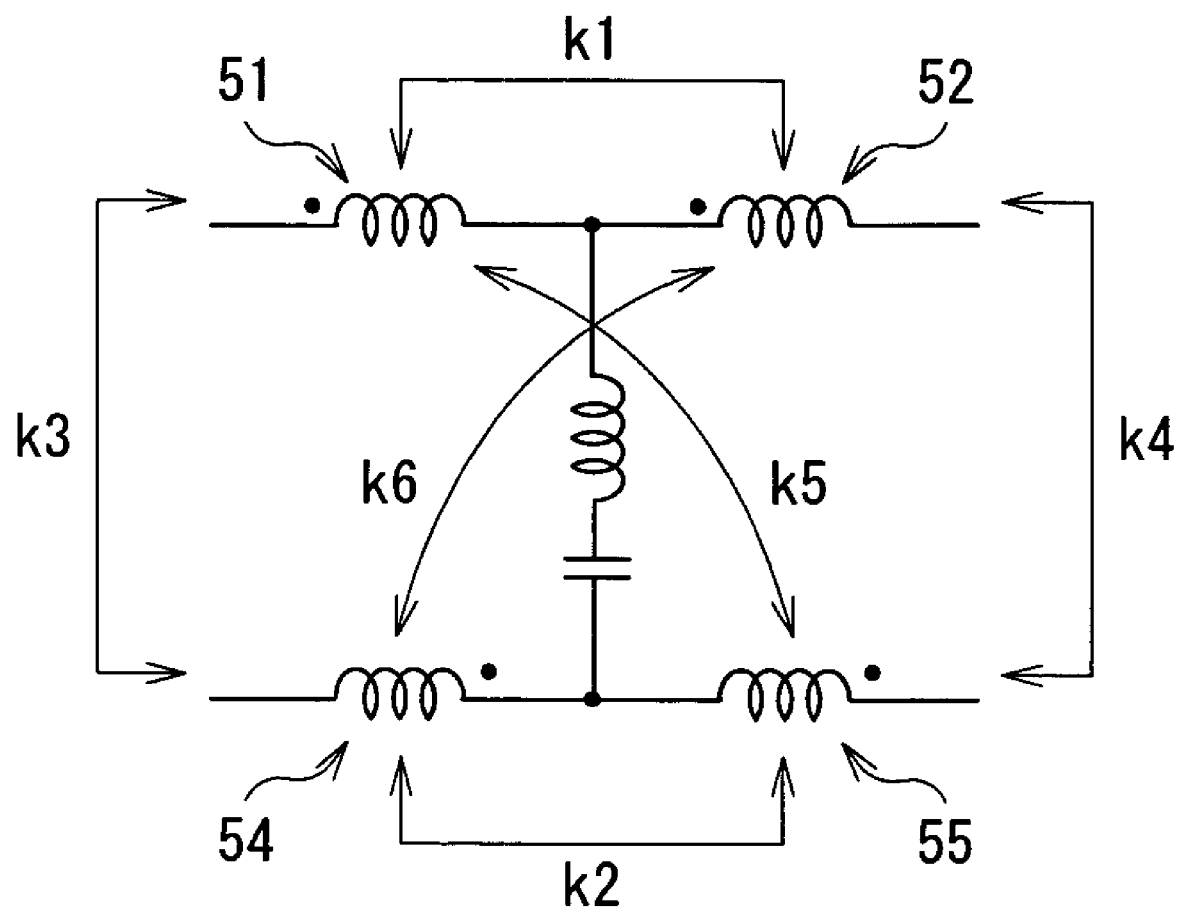
FIG. 16 is a diagram for explaining coupling coefficient between inductors in the noise suppression circuit according to the third embodiment of the invention.

As shown in FIG. 16, with respect to the noise suppression circuit according to the third embodiment, the coupling coefficient between the first and second inductors 51 and 52 is defined as k1. The coupling coefficient between the fourth and fifth inductors 54 and 55 is defined as k2. The coupling coefficient between the first and fourth inductors 51 and 54 is defined as k3. The coupling coefficient between the second and fifth inductors 52 and 55 is defined as k4. The coupling coefficient between the first and fifth inductors 51 and 55 is defined as k5. The coupling coefficient between the second and fourth inductors 52 and 54 is defined as k6. In the noise suppression circuit, the first and second inductors 51 and 52 and the fourth and fifth inductors 54 and 55 are magnetically coupled to each other, and the value of each of the coupling coefficients k1 to k6 becomes ideally 1. However, in practice, it is difficult to realize the coupling coefficient of 1.

In the noise suppression circuit according to the third embodiment, in consideration of the fact that each of the values of the coupling coefficients k1 to k6 between the inductors becomes smaller than 1 in practice, the inductance L3 of the third inductor 53 is set to a value according to the actual coupling coefficients k1 to k6 so that a desired noise attenuation characteristic is realized on condition that each of the coupling coefficients k1 to k6 is smaller than 1.

In the noise suppression circuit according to the third embodiment, the ideal state is a state in which element values are optimized on assumption that each of the coupling coefficients k1 to k6 between the inductors is equal to 1. In the embodiment, the ideal state is a state in which all of the inductances L1 and L2 of the first and second inductors 51 and 52 and the inductances L4 and L5 of the fourth and fifth inductors 54 and 55 are set to the same value L0 and the inductance L3 of the third inductor 53 is set to the value which is four times as large as L0.

In the noise suppression circuit according to the third embodiment, as will be described below, even when each of the coupling coefficients k1 to k6 is smaller than 1, by adjusting the value of the inductance L3 of the third inductor 53 in accordance with the values of the coupling coefficients k1 to k6, the attenuation characteristic which is almost the same as or similar to that in the ideal state can be obtained. Alternatively, by forming the resonance point at an arbitrary frequency, a characteristic which is more excellent than that in the ideal state can be partly obtained.

Figure 18:
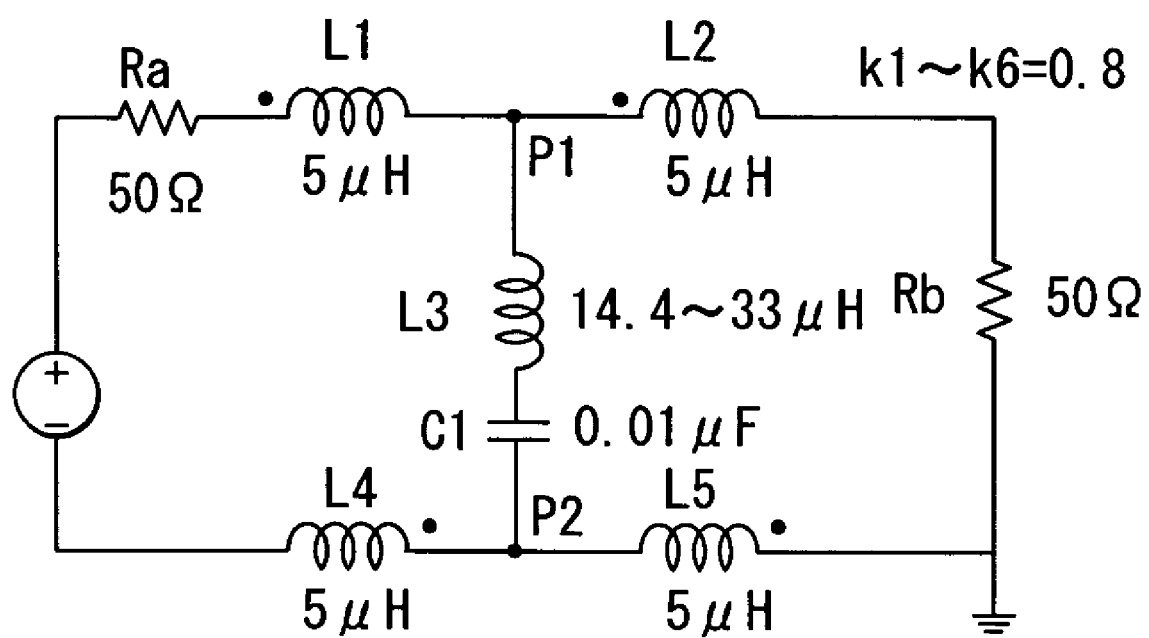
FIG. 18 is a circuit diagram showing an equivalent circuit of the noise suppression circuit used for the simulation of FIG. 17.

Next, a change in the attenuation characteristic by the value of the inductance L3 will be concretely described by using results of the following simulation. FIG. 18 shows an equivalent circuit of the noise suppression circuit used for the simulation. Ra and Rb are set as input/output impedances. In this circuit, the attenuation characteristic was calculated by setting the coupling coefficients k1 to k6=0.8 while variously changing the value of the inductance L3 in a manner similar to the second embodiment. The inductances L1 and L2 of the first and second inductors 51 and 52 and the inductances L4 and L5 of the fourth and fifth inductors 54 and 55 are set to the same value (L1, L2, L4, L5=L0=5 µH).

Figure 17:
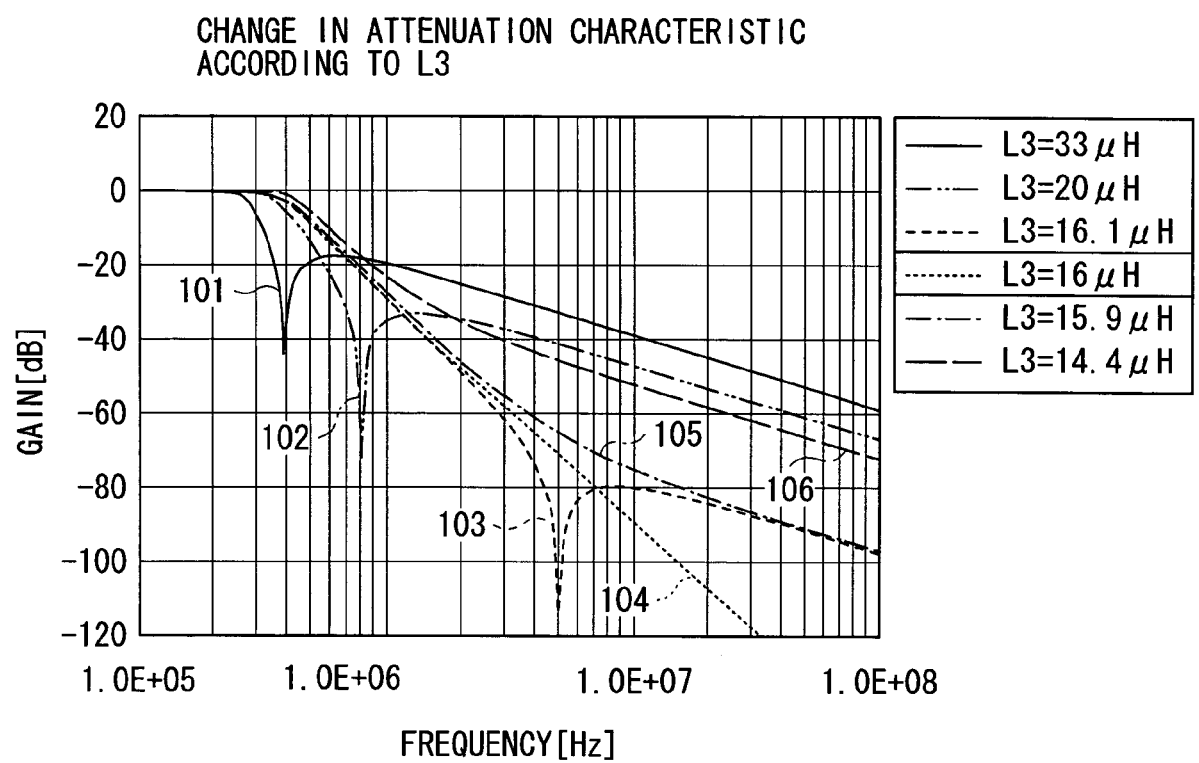
FIG. 17 is a characteristic diagram showing the result of simulation of the attenuation characteristic in the noise suppression circuit according to the third embodiment of the invention.

FIG. 17 shows the results of the simulations and is the plot of frequency characteristics of the attenuation of the normal mode noise in a manner similar to FIG. 6. FIG. 17 also shows the results of simulation in the following cases. The line indicated by reference numeral 101 shows the case where L3=34 µH. The line indicated by reference numeral 102 shows the case where L3=20 µH. The line indicated by reference numeral 103 shows the case where L3=16.1 µH. The line indicated by reference numeral 104 shows the case where L3=16 µH. The line indicated by reference numeral 105 shows the case where L3=15.9 µH. The line indicated by reference numeral 106 shows the case where L3=14.4 µH.

From the results of the simulations of FIG. 17, in a manner similar to the second embodiment, the relation between the value of the inductance L3 and the attenuation characteristic can be described as follows. According to the value of the inductance L3, the results are roughly divided into the following three conditions (A) to (C).

(A) In the case where L3=M1+M2+M5+M6

$$M1 = k1 \times (L1 \times L2)^{1/2} \quad (7\text{-}1)$$

$$M2 = k2 \times (L4 \times L5)^{1/2} \quad (7\text{-}2)$$

$$M5 = k5 \times (L1 \times L5)^{1/2} \quad (7\text{-}3)$$

$$M6 = k6 \times (L2 \times L4)^{1/2} \quad (7\text{-}4)$$

In the simulation of FIG. 17, the case corresponds to the line indicated by reference numeral 104 (L3=16 μH). In this case, even when k is less than 1, the attenuation characteristic almost the same as that in the ideal state can be obtained. Although the attenuation characteristic in the ideal state is not shown, it almost overlaps the line indicated by reference numeral 104. The ideal state in this case denotes the case where k1 to k6=1.0 and L3=4L0=20 μH in the equivalent circuit of FIG. 18.

(B) In the case where L3>M1+M2+M5+M6

In the simulation of FIG. 17, the case corresponds to the lines indicated by reference numerals 101 to 103 (L3>16 μH). In this case, a resonance point which does not exist in the ideal state appears. The resonance frequency f0 is obtained as follows.

$$f0 = 1/2\pi \sqrt{C(L3-M1-M2-M5-M6)} \quad (25)$$

$\sqrt{\phantom{x}}$ denotes the square root of C(L3−M1−M2−M5−M6). C denotes capacitance of the first capacitor 14 of the series circuit 15. Therefore, in this case, by changing the value of L3, the resonance frequency can be moved to arbitrary frequency. In the case of providing the resonance point, a region in which the attenuation characteristic is better than that in the ideal state is created, partly in the frequency region higher than the cutoff frequency. In other words, as understood also from FIG. 17, in the frequency band higher than the cutoff frequency and before it matches the characteristic in the ideal state, a region in which the attenuation characteristic is better than that in the ideal state is created.

In this case, on the basis of a desired condition that the resonance frequency f0 derived by the above equation is equal to or higher than the cutoff frequency in the ideal state, the maximum value of the inductance L3 desirably satisfies the following expression.

$$L3 \leq \times L1 + L4 + M1 + M2 + 2M3 + M5 + M6) \times (L2 + L5 + M1 + M2 + 2 \times M4 + M5 + M6)/\{L1 + L2 + L4 + L5 + 2 \times (M1 + M2 + M3 + M4 + M5 + M6)\} + M1 + M2 + M5 + M6 \quad (8)$$

In the simulation of FIG. 17, the line indicated by the reference numeral 101 shows the characteristic at the maximum value obtained by the equation (L3=33 μH).

(C) In the case where L3<M1+M2+M5+M6

In the simulation of FIG. 17, the case corresponds to the lines indicated by the reference numerals 105 and 106 (L3<16 μH). In this case, as understood also from the attenuation characteristic of FIG. 17, the characteristic similar to that in the ideal state is obtained. In particular, the characteristic almost the same as that in the ideal state is displayed to a certain frequency and, at a certain frequency or higher frequencies, the attenuation characteristic deteriorates. Consequently, if the circuit is used in the frequency range almost the same as that in the ideal state, there is an advantage when L3 is set to the conditional value.

In this case, the desirable minimum value of the inductance L3 is obtained as follows in consideration of the result of the simulation.

$$L3 \geq 0.9(M1+M2+M5+M6) \quad (9)$$

In the simulation of FIG. 17, the line indicated by reference numeral 106 shows the characteristic at the minimum value obtained by the equation (L3=14.4 μH).

The noise suppression circuits according to the foregoing embodiments can be used as means for reducing ripple voltage generated by a power converter or noise or means for reducing noise on a power line in a power line communication or preventing a communication signal on an indoor power from leaking to an outdoor power line.

What is claimed is:

1. A noise suppression circuit suppressing normal mode noise transmitted on first and second conductive lines and generating a potential difference between the first and the second conductive lines, comprising:

first and second inductors inserted in series in the first conductive line and magnetically coupled to each other; and a series circuit configured to have a third inductor and a first capacitor connected in series, one end of the series circuit being connected to a junction of the first and second inductors, and other end being connected to the second conductive line, wherein a coupling coefficient k between the first and second inductors is smaller than 1, and the inductance of the third inductor is set to a value so that a desired noise attenuation characteristic is realized on condition that the coupling coefficient k is smaller than 1.

2. The noise suppression circuit according to claim 1, wherein the inductance L3 of the third inductor satisfies the condition of $$L3 = k(L1 \times L2)^{1/2} \quad (1)$$

where L1 represents inductance of the first inductor, and L2 represents inductance of the second inductor.

3. The noise suppression circuit according to claim 1, wherein the inductance L3 of the third inductor satisfies the conditions of $$L3 > k(L1 \times L2)^{1/2} \text{ and}$$

$$L3 \leq (L1+M) \times (L2+M)/(L1+L2+2M)+M \quad (2)$$

where $M = k(L1 \times L2)^{1/2}$,

L1 represents inductance of the first inductor, and L2 represents inductance of the second inductor.

4. The noise suppression circuit according to claim 1, wherein the inductance L3 of the third inductor satisfies the conditions of $$L3 < k(L1 \times L2)^{1/2} \text{ and}$$

$$L3 \geq 0.9 \times k \times (L1 \times L2)^{1/2} \quad (3)$$

where L1 represents inductance of the first inductor, and L2 represents inductance of the second inductor.

5. A noise suppression circuit suppressing normal mode noise transmitted on first and second conductive lines and generating a potential difference between the first and the second conductive lines, comprising:

first and second inductors inserted in series in the first conductive line and magnetically coupled to each other;

a series circuit configured to have a third inductor and a first capacitor connected in series; and fourth and fifth inductors inserted in series in the second conductive line and magnetically coupled to each other, wherein one end of the series circuit is connected to a junction of the first and second inductors, and the other end is connected to a junction of the fourth and fifth inductors, each of a coupling coefficient k1 between the first and second inductors and a coupling coefficient k2 between the fourth and fifth inductors is smaller than 1, and the inductance of the third inductor is set to a value so that a desired noise attenuation characteristic is realized on condition that each of the coupling coefficients k1 and k2 is smaller than 1.

6. The noise suppression circuit according to claim 5, wherein the inductance L3 of the third inductor satisfies the conditions of $$L3 = M1 + M2,$$

$$M1 = k1 \times (L1 \times L2)^{1/2} \quad (4\text{-}1), \text{ and}$$

$$M2 = k2 \times (L4 \times L5)^{1/2} \quad (4\text{-}2)$$

where L1 represents inductance of the first inductor,
L2 represents inductance of the second inductor,
L4 represents inductance of the fourth inductor, and
L5 represents inductance of the fifth inductor.

7. The noise suppression circuit according to claim 5, wherein the inductance L3 of the third inductor satisfies the conditions of $$L3 > M1 + M2 \text{ and}$$

$$L3 \leq (L1+L4+M1+M2) \times (L2+L5+M1+M2)/\{L1+L2+L4+L5+2 \times (M1+M2)\} + M1+M2 \quad (5)$$

where $M1 = k1 \times (L1 \times L2)^{1/2}$, $M2 = k2 \times (L4 \times L5)^{1/2}$,
L1 represents inductance of the first inductor,
L2 represents inductance of the second inductor,
L4 represents inductance of the fourth inductor, and
L5 represents inductance of the fifth inductor.

8. The noise suppression circuit according to claim 5, wherein the inductance L3 of the third inductor satisfies the conditions of $$L3 < M1 + M2 \text{ and}$$

$$L3 \geq 0.9 \times (M1 + M2) \quad (6)$$

where $M1 = k1 \times (L1 \times L2)^{1/2}$, $M2 = k2 \times (L4 \times L5)^{1/2}$,
L1 represents inductance of the first inductor,
L2 represents inductance of the second inductor,
L4 represents inductance of the fourth inductor, and
L5 represents inductance of the fifth inductor.

9. A noise suppression circuit suppressing normal mode noise transmitted on first and second conductive lines and generating a potential difference between the first and the second conductive lines, comprising:
first and second inductors inserted in series in the first conductive line and magnetically coupled to each other;
a series circuit configured to have a third inductor and a first capacitor connected in series; and
fourth and fifth inductors inserted in series in the second conductive line and magnetically coupled to each other and magnetically coupled to the first and second inductors,
wherein one end of the series circuit is connected to a junction of the first and second inductors, the other end is connected to a junction of the fourth and fifth inductors,
each of a coupling coefficient k1 between the first and second inductors, a coupling coefficient k2 between the fourth and fifth inductors, a coupling coefficient k3 between the first and fourth inductors, a coupling coefficient k4 between the second and fifth inductors, a coupling coefficient k5 between the first and fifth inductors, and a coupling coefficient k6 between the second and fourth inductors is smaller than 1, and the inductance of the third inductor is set to a value so that a desired noise attenuation characteristic is realized on condition that each of the coupling coefficients k1, k2, k3, k4, k5, and k6 is smaller than 1.

10. The noise suppression circuit according to claim 9, wherein the inductance L3 of the third inductor satisfies the conditions of $$L3 = M1 + M2 + M5 + M6,$$

$$M1 = k1 \times (L1 \times L2)^{1/2} \quad (7\text{-}1),$$

$$M2 = k2 \times (L4 \times L5)^{1/2} \quad (7\text{-}2),$$

$$M5 = k5 \times (L1 \times L5)^{1/2} \quad (7\text{-}3), \text{ and}$$

$$M6 = k6 \times (L2 \times L4)^{1/2} \quad (7\text{-}4)$$

where L1 represents inductance of the first inductor,
L2 represents inductance of the second inductor,
L4 represents inductance of the fourth inductor, and
L5 represents inductance of the fifth inductor.

11. The noise suppression circuit according to claim 9, wherein the inductance L3 of the third inductor satisfies the conditions of $$L3 > M1 + M2 + M5 + M6 \text{ and}$$

$$L3 \leq (L1+L4+M1+M2+2 \times M3+M5+M6) \times (L2+L5+M1+M2+2 \times M4+M5+M6)/\{L1+L2+L4+L5+2 \times (M1+M2+M3+M4+M5+M6)\}+M1+M2+M5+M6 \quad (8)$$

where $M1 = k1 \times (L1 \times L2)^{1/2}$, $M2 = k2 \times (L4 \times L5)^{1/2}$, $M5 = k5 \times (L1 \times L5)^{1/2}$, $M6 = k6 \times (L2 \times L4)^{1/2}$,
L1 represents inductance of the first inductor,
L2 represents inductance of the second inductor,
L4 represents inductance of the fourth inductor, and
L5 represents inductance of the fifth inductor.

12. The noise suppression circuit according to claim 9, wherein the inductance L3 of the third inductor satisfies the conditions of $$L3 < M1 + M2 + M5 + M6 \text{ and}$$

$$L3 \geq 0.9 \times (M1 + M2 + M5 + M6) \quad (9)$$

where $M1 = k1 \times (L1 \times L2)^{1/2}$, $M2 = k2 \times (L4 \times L5)^{1/2}$, $M5 = k5 \times (L1 \times L5)^{1/2}$, $M6 = k6 \times (L2 \times L4)^{1/2}$,
L1 represents inductance of the first inductor,
L2 represents inductance of the second inductor,
L4 represents inductance of the fourth inductor, and
L5 represents inductance of the fifth inductor.

* * * * *